United States Patent
Hinode et al.

(10) Patent No.: US 10,699,895 B2
(45) Date of Patent: Jun. 30, 2020

(54) SUBSTRATE PROCESSING METHOD

(71) Applicant: SCREEN Holdings Co., Ltd., Kyoto (JP)

(72) Inventors: Taiki Hinode, Kyoto (JP); Sadamu Fujii, Kyoto (JP); Rei Takeaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 339 days.

(21) Appl. No.: 15/674,895

(22) Filed: Aug. 11, 2017

(65) Prior Publication Data
US 2018/0061633 A1 Mar. 1, 2018

(30) Foreign Application Priority Data

Aug. 31, 2016 (JP) ................. 2016-170170

(51) Int. Cl.
H01L 21/02 (2006.01)
H01L 21/67 (2006.01)
B08B 3/08 (2006.01)

(52) U.S. Cl.
CPC .. H01L 21/02087 (2013.01); H01L 21/02052 (2013.01); H01L 21/02057 (2013.01); H01L 21/02068 (2013.01); H01L 21/6708 (2013.01); H01L 21/6719 (2013.01); H01L 21/67028 (2013.01); H01L 21/67051 (2013.01); H01L 21/67109 (2013.01); H01L 21/67253 (2013.01); B08B 3/08 (2013.01); H01L 21/02101 (2013.01)

(58) Field of Classification Search
None
See application file for complete search history.

(56) References Cited

U.S. PATENT DOCUMENTS

2011/0240601 A1 10/2011 Hashizume et al. ............ 216/83
2014/0026926 A1 1/2014 Semmelrock et al. ......... 134/30
(Continued)

FOREIGN PATENT DOCUMENTS

EP 2966673 A1 1/2016
JP 10-125648 5/1998
(Continued)

OTHER PUBLICATIONS

English Translation of JP 2015192052, accessed on Oct. 2019. (Year: 2015).*

Primary Examiner — Eric W Golightly
Assistant Examiner — Arlyn I Rivera-Cordero
(74) Attorney, Agent, or Firm — Ostrolenk Faber LLP

(57) ABSTRACT

A substrate processing method includes a forcing member disposing step of disposing a facing member such that the facing member faces an upper surface of a horizontally held substrate; a space forming step of forming a space where movement of the atmosphere in from and out to an outside is restricted by the substrate, the facing member, and a guard that surrounds the substrate and the facing member in plan view; an inert gas supplying step of supplying an inert gas to the space; an interval adjusting step of adjusting an interval between the upper surface of the substrate and the facing member by relatively raising/lowering the facing member with respect to the substrate while maintaining the space; and a processing liquid supplying step of supplying a processing liquid to the upper surface of the substrate after the interval adjusting step.

7 Claims, 15 Drawing Sheets

(56) References Cited

U.S. PATENT DOCUMENTS

| | | | |
|---|---|---|---|
| 2014/0356539 A1 | 12/2014 | Inatomi et al. | 427/315 |
| 2016/0025409 A1 | 1/2016 | Miyazaki et al. | |
| 2016/0204006 A1 | 7/2016 | Fujii | |
| 2017/0040188 A1 | 2/2017 | Kikumoto | 156/345.23 |
| 2017/0117135 A1 | 4/2017 | Yoshida et al. | |
| 2017/0148648 A1 | 5/2017 | Yoshida | |
| 2017/0287741 A1* | 10/2017 | Yoshida | H01L 21/68764 |

FOREIGN PATENT DOCUMENTS

| | | | | |
|---|---|---|---|---|
| JP | 2009-224692 A | 10/2009 | | |
| JP | 2010-50143 | 3/2010 | | |
| JP | 2015192052 | * 11/2014 | ....... H01L 21/02307 |
| JP | 2015-126013 | 7/2015 | | |
| KR | 10-2016-0089465 | 7/2016 | | |
| TW | 201541542 A | 11/2015 | | |
| TW | 201541543 A | 11/2015 | | |

* cited by examiner

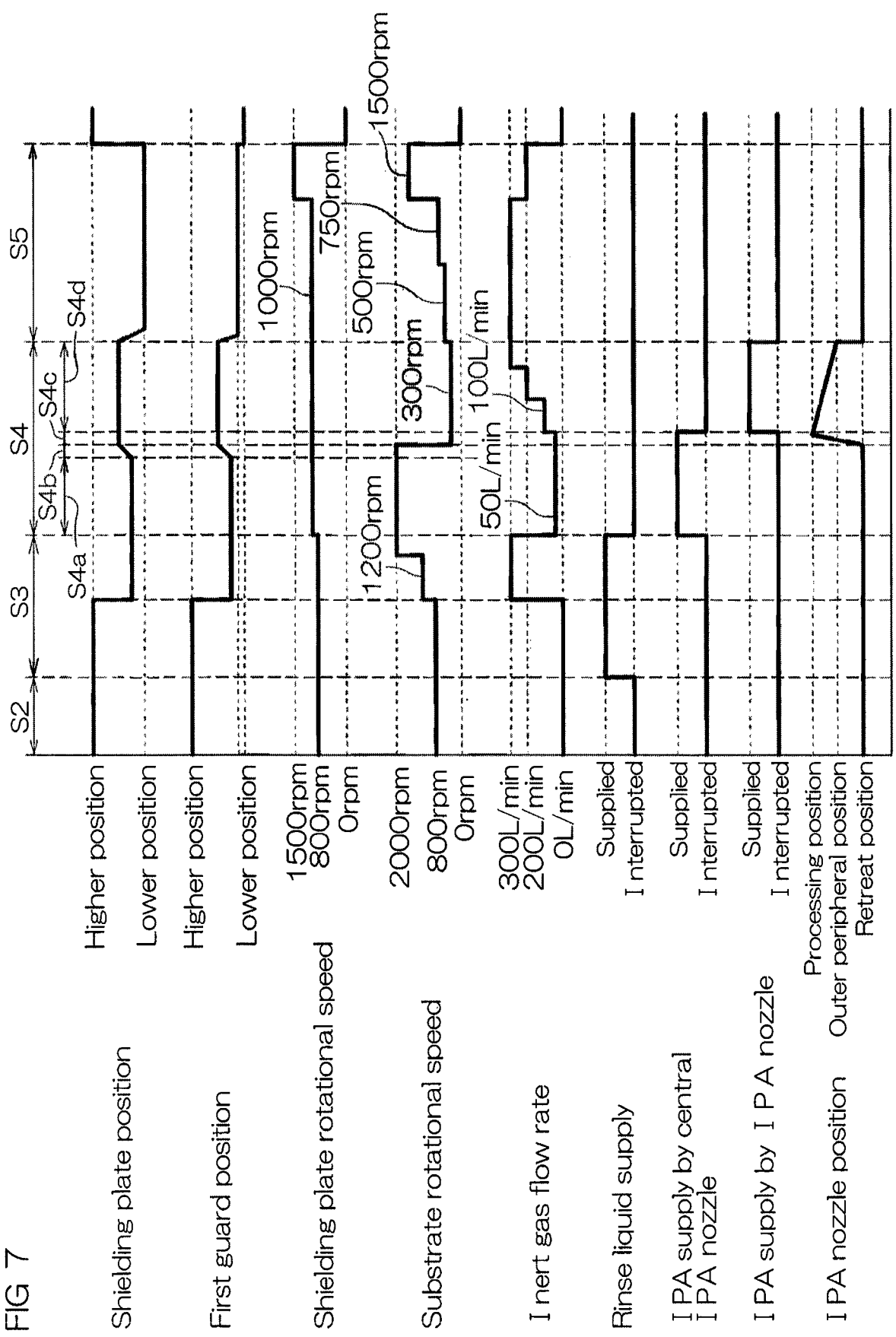

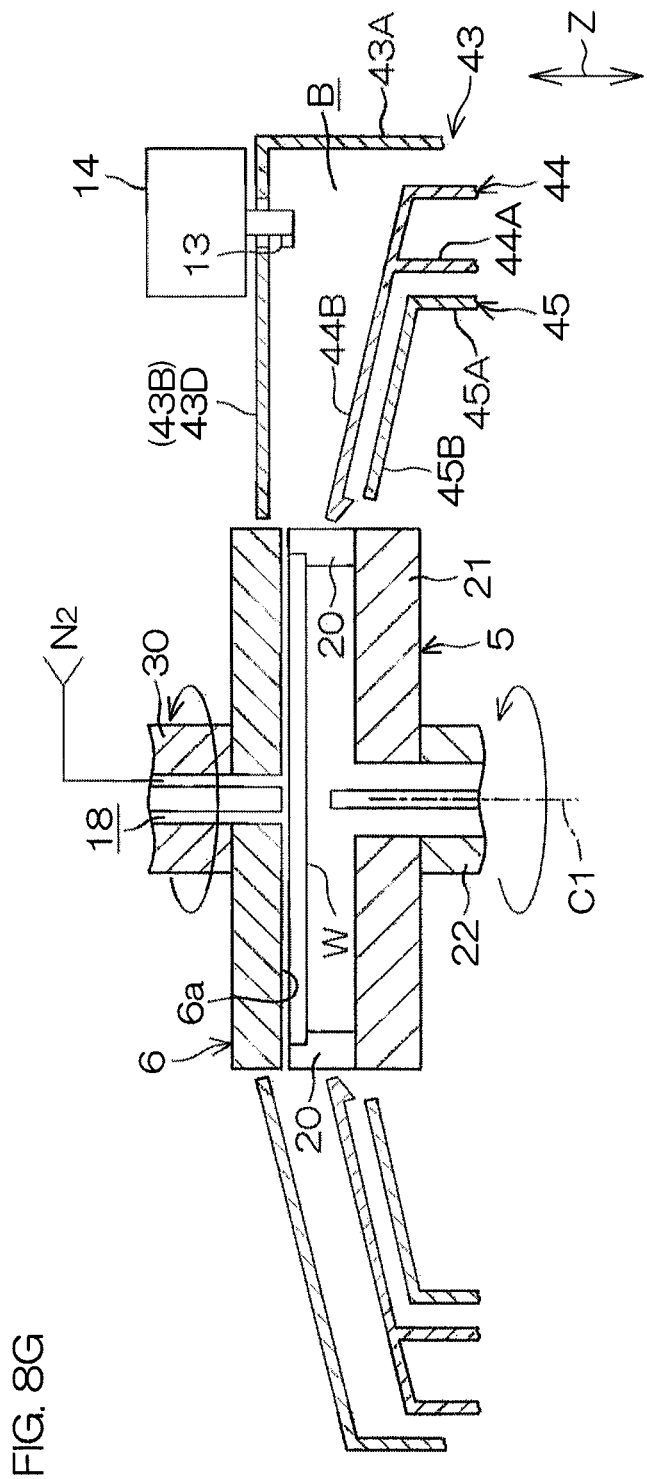

SUBSTRATE PROCESSING METHOD

BACKGROUND OF THE INVENTION

1. Field of the Invention

The present invention relates to a substrate processing method by which a substrate is processed. Examples of substrates to be processed include substrates such as semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In substrate processing with a single substrate processing type substrate processing apparatus that processes substrates one by one, a chemical liquid is supplied to a substantially horizontally held substrate by a spin chuck, for example. A rinse liquid is then supplied to the substrate. Thereby, the chemical liquid on the substrate is replaced with the rinse liquid. A spin drying step is then carried out to remove the rinse liquid on the substrate.

As shown in FIG. 9, in a case where a fine pattern is formed on the front surface of the substrate, the rinse liquid that has entered the interior of the pattern cannot be removed in the spin drying step. Thus, drying defects may be caused. A liquid surface of the rinse liquid that has entered the interior of the pattern (an interface between the air and the liquid) is formed in the interior of the pattern. Therefore, surface tension acts on the liquid at a position where the liquid surface and the pattern are in contact. In a case where the surface tension is high, the pattern is more likely to collapse. Water, a typical rinse liquid, has high surface tension. Therefore, collapse of the pattern in the spin drying step cannot be ignored.

Thus, in order to dry the upper surface of the substrate, it can be considered to supply isopropyl alcohol (IPA), which is a low surface tension liquid with lower surface tension than water, replace the water which has entered the interior of the pattern with the IPA, thereafter remove the IPA.

In order to remove the IPA to rapidly dry the upper surface of the substrate, there is a need for reducing the humidity of the atmosphere around the upper surface of the substrate. In addition, the pattern may be oxidized by oxygen dissolved into the IPA. Thus, there is a need for reducing the oxygen concentration of the atmosphere around the upper surface of the substrate such that the amount of oxygen that dissolves into the IPA is reduced. However, since the members such as the spin chuck are housed in the interior space of a processing chamber, it is difficult to sufficiently reduce the oxygen concentration and the humidity of the entire atmosphere in the processing chamber.

United States Patent Application Publication No. 2011/240601 discloses a substrate processing apparatus capable of supplying a processing liquid to the front surface of a wafer horizontally held in a seal chamber that houses a portion of a spin chuck. The seal chamber includes a chamber body having an opening, and a lid member that opens and closes the opening. By sealing between the chamber body and the lid member by a liquid seal structure, the interior space of the seal chamber is shielded from the atmosphere outside the seal chamber.

A nozzle arm is inserted through an insertion hole formed in a partition wall of the chamber body. A processing liquid nozzle is attached to the nozzle arm. By moving the nozzle arm, the processing liquid nozzle can be moved onto the front surface of the wafer. In addition, a hollow rotating shaft is fixed to the lid member. An upper processing liquid nozzle is inserted through the rotating shaft. In a state where the interior space of the seal chamber is shielded from the atmosphere outside the seal chamber, a processing liquid can be supplied to the wafer from the processing liquid nozzle or the upper processing liquid nozzle.

SUMMARY OF THE INVENTION

In the substrate processing apparatus of United States Patent Application Publication No. 2011/240601, by closing the upper opening of the chamber body, the interior space of the seal chamber is shielded from the atmosphere outside the seal chamber. However, in a state where the upper opening of the chamber body is closed, relative positions of a substrate and the partition wall of the chamber body are fixed in the vertical direction.

Meanwhile, a case is assumed where a distance between a lid member and the substrate is desired to be reduced in spin drying, etc., where there is no need for supplying a processing liquid from a processing liquid nozzle to a substrate, or a case where the distance between the lid member and the substrate is desired to be increased for preventing backlash and adhesion of the processing liquid to the lid member. The substrate processing apparatus of United States Patent Application Publication No. 2011/240601 cannot address these cases.

Thus, in the substrate processing apparatus described in United States Patent Application Publication No. 2011/240601, the distance between the substrate and the lid member cannot properly be changed in accordance with the details of substrate processing.

Therefore, one object of the present invention is to provide a substrate processing method capable of processing a substrate in a state where the oxygen concentration and the humidity of the atmosphere between a horizontally held substrate and a facing member are reduced and a proper interval is maintained between the substrate and the facing member.

The present invention provides a substrate processing method comprising a substrate holding step of holding a substrate horizontally, a facing-disposing step of disposing a facing member such that the facing member faces an upper surface of the horizontally held substrate, a space forming step of forming a space where movement of an atmosphere in from and out to an outside is restricted by the horizontally held substrate, the facing member, and a guard that surrounds the horizontally held substrate and the facing member in plan view, an inert gas supplying step of supplying an inert gas to the space, an interval adjusting step of adjusting an interval between the upper surface of the substrate and the facing member by relatively raising/lowering the facing member with respect to the horizontally held substrate while maintaining the space, and a processing liquid supplying step of supplying a processing liquid to the upper surface of the horizontally held substrate after the interval adjusting step.

According to this method, the space where the movement of the atmosphere in from and out to the outside is restricted is formed by the horizontally held substrate, the facing member disposed such that the facing member faces the upper surface of the substrate, and the guard that surrounds the substrate and the facing member in plan view. By supplying the inert gas to the space and replacing the atmosphere with the inert gas, the oxygen concentration and the humidity of the atmosphere between the substrate and the facing member are rapidly reduced. By relatively raising/lowering the facing member with respect to the substrate while maintaining the space, the interval between the upper surface of the substrate and the facing member is properly adjusted in a state where the oxygen concentration and the humidity of the atmosphere between the substrate and the facing member are reduced. Therefore, in a state where the oxygen concentration and the humidity of the atmosphere between the substrate and the facing member are reduced and a proper interval is maintained between the substrate and the facing member, the processing liquid can be supplied to the substrate and the substrate can be processed.

According to the preferred embodiment of the present invention, the interval adjusting step includes a step of maintaining a state where an outer edge portion of the facing member and an inner edge portion of the guard face each other. According to this method, at the time of adjusting the interval between the upper surface of the substrate and the facing member, the state where the outer edge portion of the facing member and the inner edge portion of the guard face each other is maintained. Therefore, the movement of the atmosphere between the space formed by the substrate, the facing member, and the guard, and the outside of the space can be further restricted.

According to the preferred embodiment of the present invention, the interval adjusting step includes a step of relatively raising/lowering the guard together with the facing member with respect to the horizontally held substrate. According to this method, by relatively raising/lowering the guard together with the facing member with respect to the substrate, the space formed by the substrate, the facing member, and the guard is more easily maintained. Therefore, freedom of adjustment of the interval between the upper surface of the substrate and the facing member is improved.

According to the preferred embodiment of the present invention, the interval adjusting step includes a step of relatively raising/lowering the facing member and the guard with respect to the horizontally held substrate at the same speed. According to this method, the facing member and the guard are relatively raised/lowered with respect to the substrate at the same speed. Therefore, during the adjustment of the interval between the upper surface of the substrate and the facing member, extension of the interval between the facing member and the guard can be suppressed. Therefore, the movement of the atmosphere between the space formed by the substrate, the facing member, and the guard, and the outside of the space can be even further restricted.

According to the preferred embodiment of the present invention, the interval adjusting step includes a step of relatively raising/lowering the facing member and the guard with respect to the horizontally held substrate at the same time. According to this method, the facing member and the guard are relatively raised/lowered with respect to the substrate at the same time. Therefore, the movement of the atmosphere between the space formed by the substrate, the facing member, and the guard, and the outside of the space can be even further restricted.

According to the preferred embodiment of the present invention, the interval adjusting step includes a step of adjusting the interval between the upper surface of the horizontally held substrate and the facing member such that a processing liquid supply nozzle extending from the guard to an inner side of the space moves between the horizontally held substrate and the facing member.

According to this method, the interval between the upper surface of the substrate and the facing member is adjusted such that the processing liquid supply nozzle extending from the guard to the inner side of the space is capable of moving between the substrate and the facing member. Therefore, the processing liquid supply nozzle can supply the processing liquid to the upper surface of the substrate in a state where the atmosphere in the space is replaced with the inert gas, that is, in a state where the oxygen concentration and the humidity in the atmosphere are reduced.

According to the preferred embodiment of the present invention, the inert gas supplying step is started before the interval adjusting step is ended. Therefore, in substrate processing, a time until the start of supply of the processing liquid to the upper surface of the substrate in a state where the oxygen concentration and the humidity of the atmosphere between the substrate and the facing member are reduced and the interval between the upper surface of the substrate and the facing member is properly adjusted, is shortened.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a time chart for explaining the details of substrate processing.

FIG. 8A to FIG. 8G are illustrative sectional views for explaining the details of substrate processing.

DETAILED DESCRIPTION OF THE PREFERRED EMBODIMENTS

Figure 1:
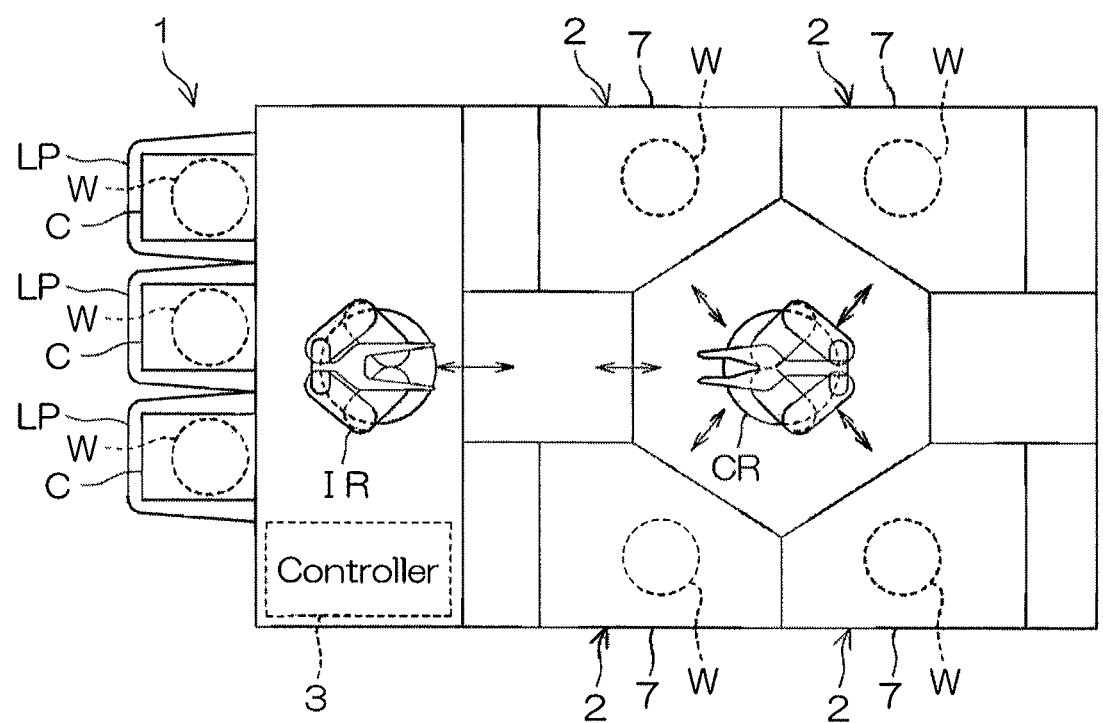
FIG. 1 is an illustrative plan view for explaining a layout of the interior of a substrate processing apparatus according to a preferred embodiment of the present invention.
Figure 9:
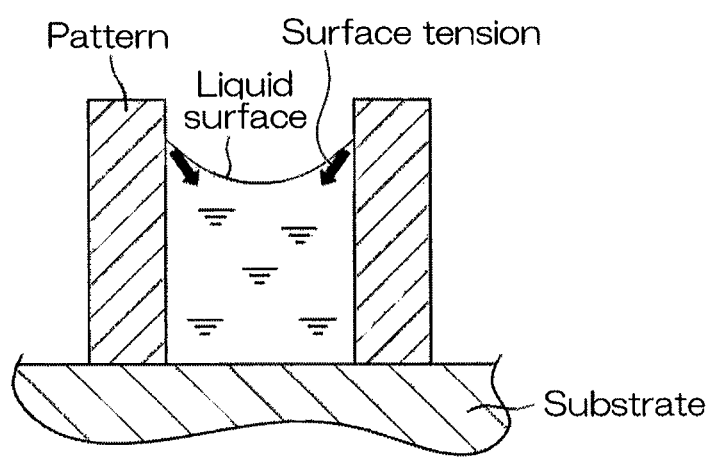
FIG. 9 is an illustrative sectional view for explaining principles of pattern collapse due to surface tension.

FIG. 1 is an illustrative plan view for explaining a layout of the interior of a substrate processing apparatus 1 according to a preferred embodiment of the present invention. The substrate processing apparatus 1 is a single substrate processing type apparatus that processes substrates W such as silicon wafers one by one with a processing liquid. The processing liquid includes a chemical liquid, a rinse liquid, an organic solvent, etc. In this preferred embodiment, each of the substrates W is a circular substrate. A fine pattern is formed on the front surface of the substrate W (refer to FIG. 9).

The substrate processing apparatus 1 includes a plurality of processing units 2 that process the substrates W with the processing liquid, a plurality of load ports LP that respectively hold carriers C housing the plurality of substrates W to be processed by the processing units 2, transfer robots IR and CR that transfer the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. The plurality of processing units 2 may have the same configuration, for example.

Figure 2:
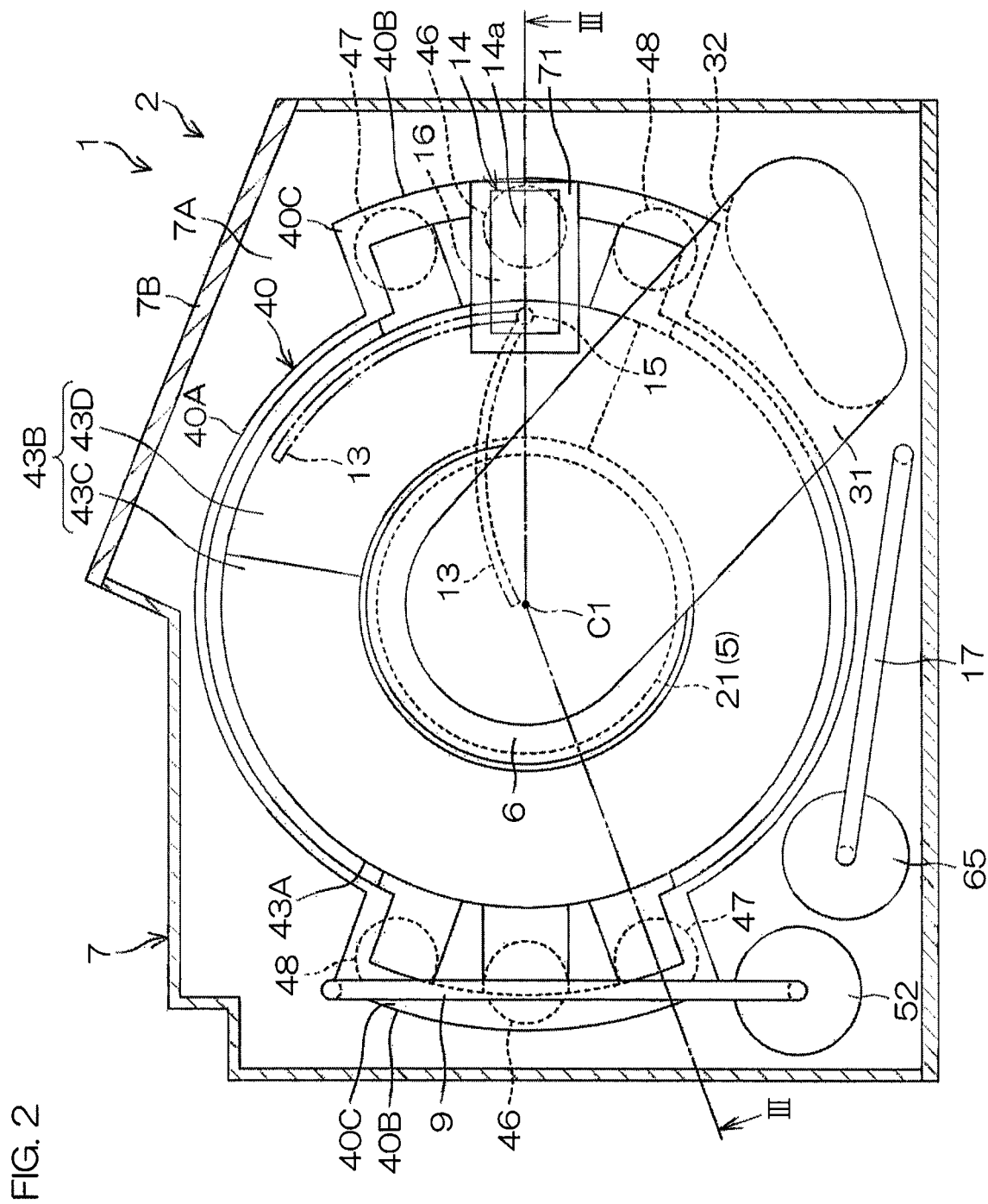
FIG. 2 is an illustrative cross-sectional view for explaining a configuration example of a processing unit provided in the substrate processing apparatus.
Figure 3:
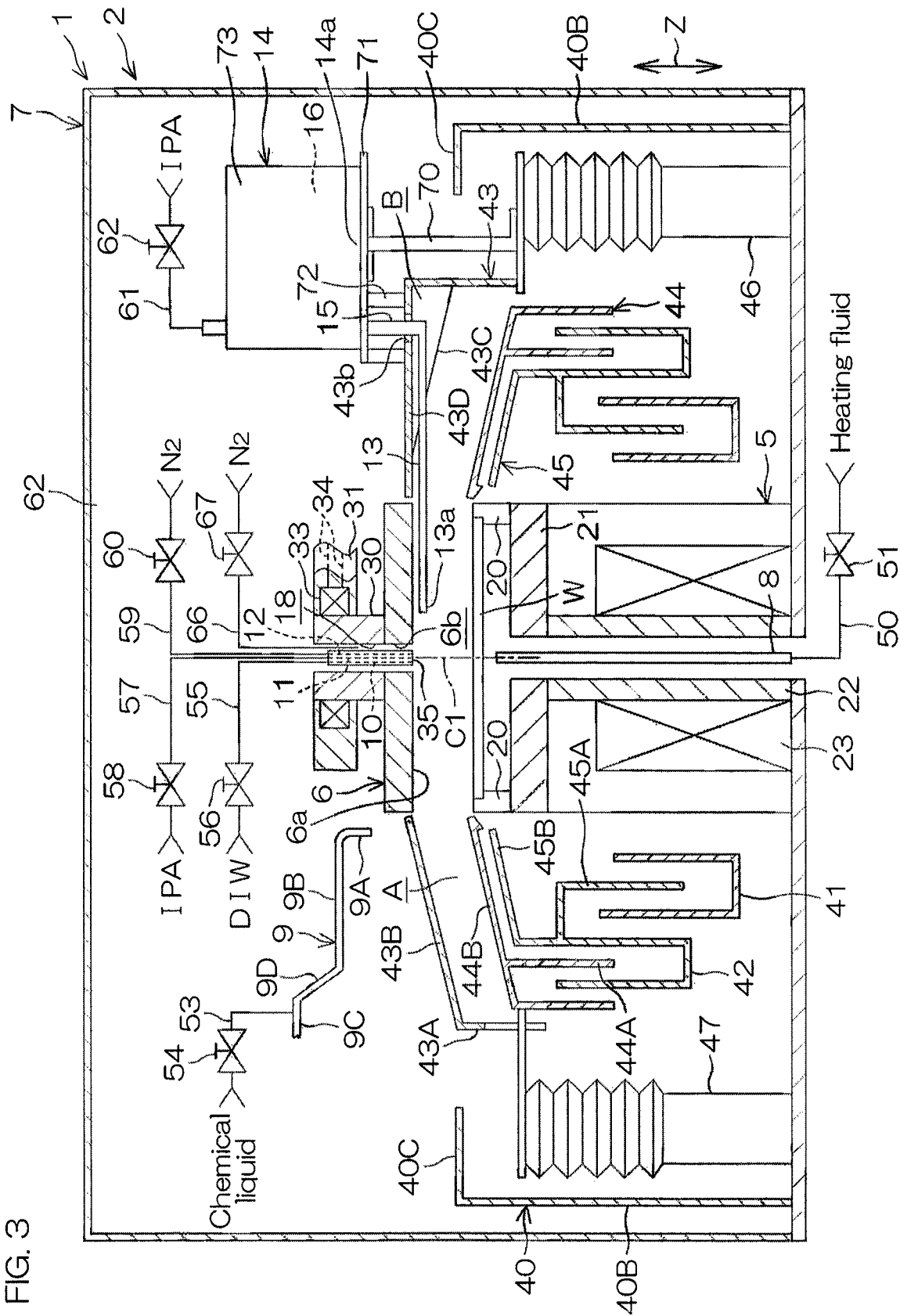
FIG. 3 corresponds to a vertically sectional view taken along line in FIG. 2 and is a schematic view for explaining the configuration example of the processing unit.

FIG. 2 is an illustrative cross-sectional view for explaining a configuration example of the processing unit 2. FIG. 3 corresponds to a vertically sectional view taken along line in FIG. 2. FIG. 3 is a schematic view for explaining the configuration example of the processing unit 2.

The processing unit 2 includes a spin chuck 5 that rotates a single substrate W around a vertical rotational axis C1 running through the center of the substrate W while holding the substrate W in a horizontal orientation. The spin chuck 5 is an example of a substrate holding unit that holds the substrate W horizontally. The processing unit 2 further includes a shielding plate 6 having a facing surface 6a which faces the upper surface of the substrate W (the main surface on the upper side), and a chamber 7 housing the substrate W for processing the substrate W with the processing liquid. The shielding plate 6 is an example of a facing member. In the chamber 7, a carry-in/carry-out port 7A for carrying in and carrying out the substrate W is formed. A shutter unit 7B that opens and closes the carry-in/carry-out port 7A is provided in the chamber 7.

The spin chuck 5 includes chuck pins 20, a spin base 21, a rotating shaft 22, and an electric motor 23 that rotates the rotating shaft 22 around the rotational axis C1.

The rotating shaft 22 extends in the vertical direction along the rotational axis C1 (also referred to as the vertical direction Z). In this preferred embodiment, the rotating shaft 22 is a hollow shaft. The upper end of the rotating shaft 22 is coupled to the center of the lower surface of the spin base 21. The spin base 21 has a disk shape along the horizontal direction. The plurality of chuck pins 20 that grip the substrate W are disposed at intervals in the circumferential direction in the peripheral edge portion of the upper surface of the spin base 21. By rotating the rotating shaft 22 by the electric motor 23, the substrate W is rotated around the rotational axis C1. Hereinafter, the inner side in the rotation radial direction of the substrate W shall be referred to simply as the "radially inner side," and the outer side in the rotation radial direction of the substrate W shall be referred to simply as the "radially outer side."

The shielding plate 6 is formed as a disk shape having the substantially same diameter as the substrate W or the larger diameter than the substrate W. The shielding plate 6 is disposed substantially horizontally above the spin chuck 5. A hollow shaft 30 is fixed to the surface on the opposite side of the facing surface 6a of the shielding plate 6. In the portion of the shielding plate 6 including a position overlapping with the rotational axis C1 in plan view, a communicating hole 6b which penetrates the shielding plate 6 vertically and communicates with the interior space of the hollow shaft 30, is formed.

The processing unit 2 further includes a shielding plate support member 31, a shielding plate raising/lowering mechanism 32, and a shielding plate rotating mechanism 33. The shielding plate support member 31 extends horizontally and supports the shielding plate 6 via the hollow shaft 30. The shielding plate raising/lowering mechanism 32 is coupled to the shielding plate 6 via the shielding plate support member 31 and drives raising and lowering of the shielding plate 6. The shielding plate rotating mechanism 33 rotates the shielding plate 6 around the rotational axis C1.

Figure 8A:
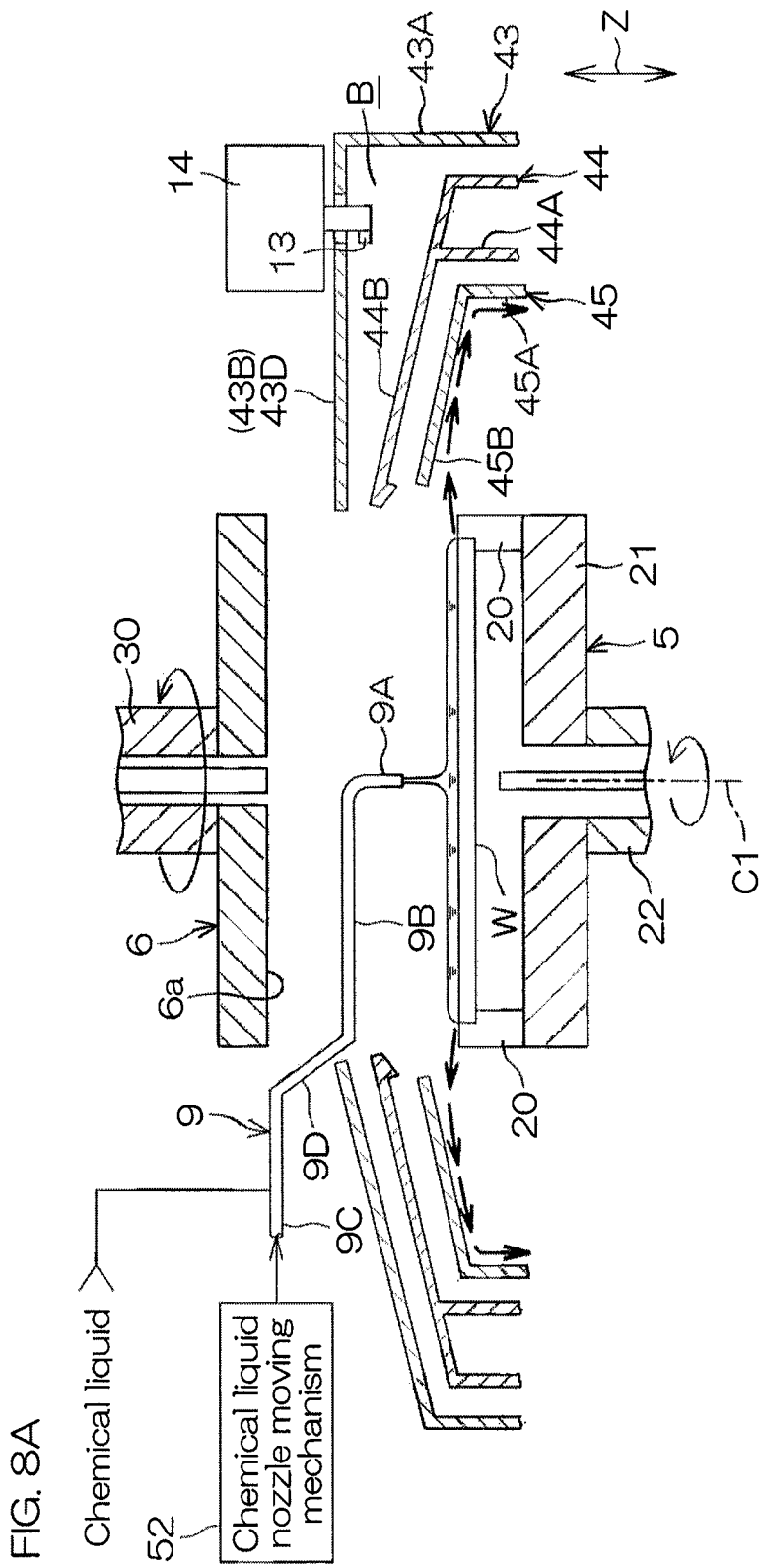

The shielding plate raising/lowering mechanism 32 can position the shielding plate 6 at any desired position (height) from a lower position (position shown in FIG. 8G to be described later) to a higher position (position shown in FIG. 8A to be described later). The lower position is a position within the movable range of the shielding plate 6, where the facing surface 6a of the shielding plate 6 is the closest to the substrate W. In a state where the shielding plate 6 is positioned at the lower position, a distance between the upper surface of the substrate W and the facing surface 6a is 0.5 mm, for example. The higher position is a position within the movable range of the shielding plate 6, where the facing surface 6a of the shielding plate 6 is the most distant from the substrate W. In a state where the shielding plate 6 is positioned at the higher position, the distance between the upper surface of the substrate W and the facing surface 6a is 80 mm, for example.

The shielding plate rotating mechanism 33 includes an electric motor built into the tip of the shielding plate support member 31. A plurality of wirings 34 disposed inside the shielding plate support member 31 are connected to the electric motor. The plurality of wirings 34 include a power line for power transmission to the electric motor, and an encoder line for output of rotational information of the shielding plate 6. By detecting the rotational information of the shielding plate 6, rotation of the shielding plate 6 can be accurately controlled.

The processing unit 2 further includes an exhaust bucket 40 that surrounds the spin chuck 5, a plurality of cups 41, 42 (a first cup 41 and a second cup 42) disposed between the spin chuck 5 and the exhaust bucket 40, and a plurality of guards 43 to 45 (a first guard 43, a second guard 44, and a third guard 45) that receive the processing liquid removed off the substrate W from the substrate W held by the spin chuck 5.

The processing unit 2 further includes a plurality of guard raising/lowering mechanisms 46 to 48 (first guard raising/lowering mechanisms 46, second guard raising/lowering mechanisms 47, and third guard raising/lowering mechanisms 48) that drive raising and lowering of the plurality of guards 43 to 45, respectively. In the present preferred embodiment, each pair of the guard raising/lowering mechanisms 46 to 48 is provided in point symmetry with respect to the rotational axis C1 of the substrate W in plan view. Thereby, the plurality of guards 43 to 45 can be respectively stably raised and lowered.

The exhaust bucket 40 includes a cylinder portion 40A of a cylindrical shape, a plurality of (two, in the present preferred embodiment) projecting portions 40B projecting from the cylinder portion 40A to the radially outer side of the cylinder portion 40A, and a plurality of lid portions 40C attached to the upper ends of the plurality of projecting portions 40B. The plurality of guard raising/lowering mechanisms 46 to 48 are disposed at the same positions as the projecting portions 40B in a circumferential direction of the cylinder portion 40A on the radially inner side of the projecting portions 40B. In detail, one set of the first guard raising/lowering mechanism 46, the second guard raising/lowering mechanism 47, and the third guard raising/lowering mechanism 48 is disposed at the same position as each of the projecting portions 40B in the circumferential direction of the cylinder portion 40A.

Each of the cups 41, 42 has an annular groove opening upward. Each of the cups 41, 42 surrounds the spin chuck 5 on the radially inner side of the cylinder portion 40A of the exhaust bucket 40. The second cup 42 is disposed on the radially outer side of the first cup 41. The second cup 42 is integrated with the third guard 45, for example. The second cup 42 is raised and lowered together with the third guard 45. A recovery piping (not shown) or a discharge piping (not shown) is connected to the groove of each of the cups 41, 42. The processing liquid guided to the bottom portion of each of the cups 41, 42 is recovered or discarded through the recovery piping or the discharge piping.

The guards 43 to 45 are disposed so as to surround the spin chuck 5 and the shielding plate 6 in plan view.

The first guard 43 includes a first cylindrical portion 43A that surrounds the spin chuck 5 on the radially inner side of the cylinder portion 40A of the exhaust bucket 40, and a first extension portion 43B that extends to the radially inner side from the first cylindrical portion 43A.

The first guard 43 is raised and lowered between a lower position and a higher position by the first guard raising/lowering mechanisms 46. When the first guard 43 is positioned at the lower position, the upper end of the first guard 43 is positioned lower than the substrate W. When the first guard 43 is positioned at the higher position, the upper end of the first guard 43 is positioned higher than the substrate W. By being raised and lowered by the first guard raising/lowering mechanisms 46, the first guard 43 can be positioned at a shielding plate facing position and a substrate facing position between the lower position and the higher position. When the first guard 43 is positioned at the substrate facing position, the first extension portion 43B faces the substrate W from the horizontal direction.

Figure 4:
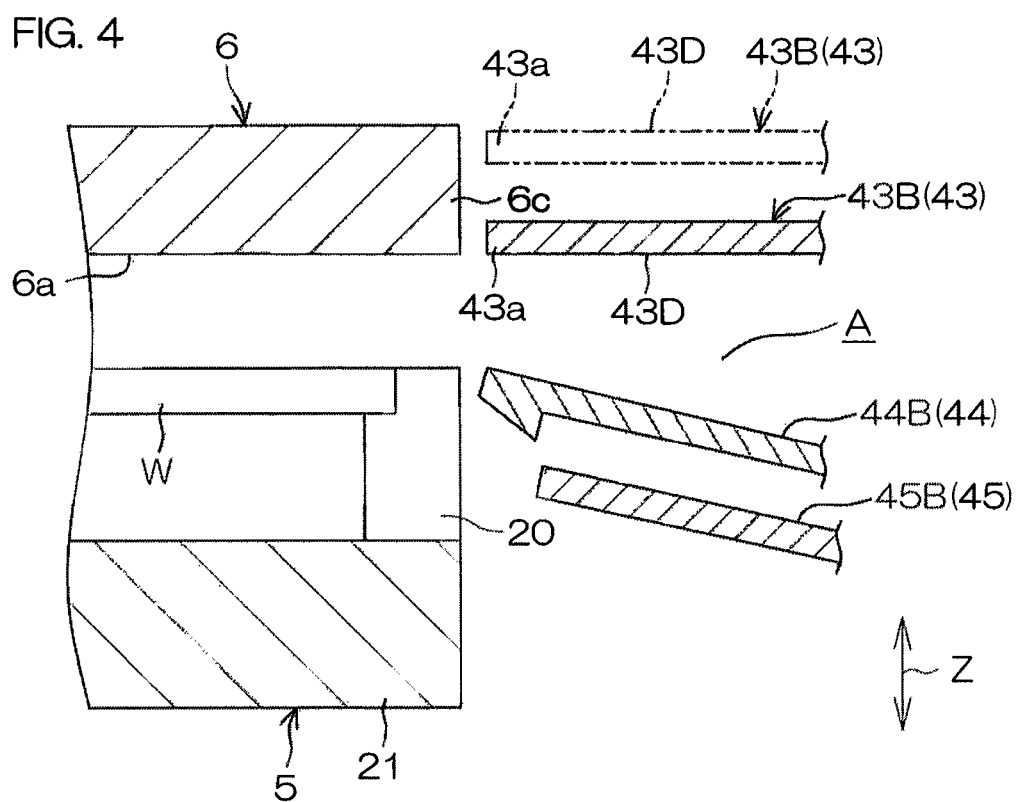
FIG. 4 is an enlarged schematic view of the vicinity of an outer edge portion of a facing member.

FIG. 4 is an enlarged schematic view of the vicinity of an outer edge portion 6c of the shielding plate 6. With reference to FIG. 4, when the first guard 43 is positioned at the shielding plate facing position, the first guard 43 is positioned between a position where an inner edge portion 43a of the first extension portion 43B faces the upper end of the outer edge portion 6c of the shielding plate 6 from the horizontal direction (position shown by a two short dashed line in FIG. 4) and a position where the inner edge portion 43a of the first extension portion 43B faces the lower end of the outer edge portion 6c of the shielding plate 6 from the horizontal direction (position shown by a solid line in FIG. 4). When the first guard 43 is positioned at the shielding plate facing position, a distance between the inner edge portion 43a of the first extension portion 43B and the outer edge portion 6c of the shielding plate 6 in the horizontal direction is 2 mm to 5 mm, for example.

When the first guard 43 is positioned at the shielding plate facing position, the first guard 43, together with the substrate W held on the spin chuck 5 and the shielding plate 6, can form a space A where movement of the atmosphere in from and out to the outside is restricted. The outside of the space A is the space higher than the shielding plate 6 and the space on the radially outer side of the first guard 43. The space A only needs to be formed such that a flow of a fluid between the atmosphere inside the space A and the atmosphere outside the space A is restricted. The space A does not necessarily have to be formed such that the atmosphere inside the space A is completely shielded from the atmosphere outside the space A.

With reference to FIG. 2 and FIG. 3, the second guard 44 includes a second cylindrical portion 44A that surrounds the spin chuck 5 on the radially inner side of the first cylindrical portion 43A of the first guard 43, and a second extension portion 44B that extends to the radially inner side from the second cylindrical portion 44A. The second extension portion 44B is inclined with respect to the horizontal direction so as to rise upward as the second extension portion 44B approaches the radially inner side. The second extension portion 44B faces the first extension portion 43B from the lower side.

The second guard 44 is raised and lowered between a lower position and a higher position by the second guard raising/lowering mechanisms 47. When the second guard 44 is positioned at the lower position, the upper end of the second guard 44 is positioned lower than the substrate W. When the second guard 44 is positioned at the higher position, the upper end of the second guard 44 is positioned higher than the substrate W. By being raised and lowered by the second guard raising/lowering mechanisms 47, the second guard 44 can be positioned at a substrate facing position between the lower position and the higher position. When the second guard 44 is positioned at the substrate facing position, (the upper side end of) the second extension portion 44B faces the substrate W from the horizontal direction. When the second guard 44 is positioned at the substrate facing position, the space A is partitioned by the second guard 44 from the lower side.

The third guard 45 includes a third cylindrical portion 45A that surrounds the spin chuck 5 on the radially inner side of the second cylindrical portion 44A of the second guard 44, and a third extension portion 45B that extends to the radially inner side from the third cylindrical portion 45A. The third extension portion 45B faces the second extension portion 44B from the lower side.

The third guard 45 is raised and lowered between a lower position and a higher position by the third guard raising/lowering mechanisms 48 (refer to FIG. 2). When the third guard 45 is positioned at the lower position, the upper end of the third guard 45 is positioned lower than the substrate W. When the third guard 45 is positioned at the higher position, the upper end of the third guard 45 is positioned higher than the substrate W. By being raised and lowered by the third guard raising/lowering mechanisms 48, the third guard 45 can be positioned at a substrate facing position between the lower position and the higher position. When the third guard 45 is positioned at the substrate facing position, (the upper side end of) the third extension portion 45B faces the substrate W from the horizontal direction.

The processing unit 2 includes a lower surface nozzle 8 that supplies a heating fluid to the lower surface of the substrate W, and a chemical liquid nozzle 9 that supplies a chemical liquid such as hydrofluoric acid to the upper surface of the substrate W.

The lower surface nozzle 8 is inserted through the rotating shaft 22. The lower surface nozzle 8 has a discharge port facing the center of the lower surface of the substrate W at the upper end. A heating fluid such as hot water is supplied from a heating fluid supply source to the lower surface nozzle 8 via a heating fluid supply pipe 50. A heating fluid valve 51 that opens and closes a flow passage of the heating fluid supply pipe 50 is interposed in the heating fluid supply pipe 50. Hot water is water at a higher temperature than room temperature, such as 80° C. to 85° C. The heating fluid is not limited to hot water but may be a gas such as a high-temperature nitrogen gas, or any fluid that can heat the substrate W.

The chemical liquid is supplied from a chemical liquid supply source to the chemical liquid nozzle 9 via a chemical liquid supply pipe 53. A chemical liquid valve 54 that opens and closes a flow passage in the chemical liquid supply pipe 53 is interposed in the chemical liquid supply pipe 53.

The chemical liquid is not limited to hydrofluoric acid but may be a liquid containing at least one of sulfuric acid, acetic acid, nitric acid, hydrochloric acid, hydrofluoric acid, ammonia water, hydrogen peroxide water, organic acids (such as citric acid, oxalic acid, etc.), organic alkalis (such as TMAH: tetramethylammonium hydroxide, etc.), surfactants, and corrosion inhibitors. Examples of a chemical liquid containing mixture of these include SPM (sulfuric acid/hydrogen peroxide mixture) and SC1 (ammonia-hydrogen peroxide mixture), etc.

The chemical liquid nozzle 9 is moved in the vertical direction and the horizontal direction by a chemical liquid nozzle moving mechanism 52 (refer to FIG. 2). The chemical liquid nozzle 9 is moved between a center position and a retreat position by movement in the horizontal direction. When the chemical liquid nozzle 9 is positioned at the center position, the chemical liquid nozzle 9 faces a rotation center position of the upper surface of the substrate W. When the chemical liquid nozzle 9 is positioned at the retreat position, the chemical liquid nozzle 9 does not face the upper surface of the substrate W. The rotation center position of the upper surface of the substrate W is a position which crosses the rotational axis C1, of the upper surface of the substrate W. The retreat position is a position on the outer side of the spin base 21 in plan view.

The chemical liquid nozzle 9 may have a stepwise bent shape. The chemical liquid nozzle 9 includes a nozzle tip portion 9A, a first horizontal portion 9B, a second horizontal portion 9C, and a coupling portion 9D. The nozzle tip portion 9A extends downward and discharges the chemical liquid. The first horizontal portion 9B extends horizontally from the upper end of the nozzle tip portion 9A. The second horizontal portion 9C extends horizontally at a position higher than the first horizontal portion 9B. The coupling portion 9D extends in the direction inclined with respect to the horizontal direction and couples the first horizontal portion 9B and the second horizontal portion 9C.

The processing unit 2 further includes a DIW nozzle 10, a central IPA nozzle 11, and an inert gas nozzle 12. The DIW nozzle 10 supplies deionized water (DIW) serving as a rinse liquid to a center region of the upper surface of the substrate W. The central IPA nozzle 11 supplies IPA serving as an organic solvent to the center region of the upper surface of the substrate W. The inert gas nozzle 12 supplies an inert gas such as a nitrogen gas (N2) to the center region of the upper surface of the substrate W. The center region of the upper surface of the substrate W is a region that includes the position crossing the rotational axis C1 on the upper surface of the substrate W, around the center of the upper surface of the substrate W.

In this preferred embodiment, the nozzles 10 to 12 are housed in common in a nozzle housing member 35 that is inserted through the interior space of the hollow shaft 30 and the communicating hole 6b of the shielding plate 6. The nozzles 10 to 12 can discharge the DIW, the IPA, and the inert gas, respectively. The tips of the respective nozzles 10 to 12 are disposed at heights substantially equal to the facing surface 6a of the shielding plate 6. Even in a state where the space A is formed, the respective nozzles 10 to 12 can supply the DIW, the IPA, and the inert gas, respectively, to the center region of the upper surface of the substrate W.

The DIW is supplied from a DIW supply source to the DIW nozzle 10 via a DIW supply pipe 55. A DIW valve 56 that opens and closes a flow passage in the DIW supply pipe 55 is interposed in the DIW supply pipe 55.

The DIW nozzle 10 may also be a rinse liquid nozzle that supplies a rinse liquid other than the DIW. Examples of a rinse liquid other than the DIW include carbonated water, electrolyzed ion water, ozone water, aqueous hydrochloric acid solutions of dilute concentration (of about 10 ppm to 100 ppm, for example), and reduced water (hydrogen water), etc.

The IPA is supplied from an IPA supply source to the central IPA nozzle 11 via a central IPA supply pipe 57. A central IPA valve 58 that opens and closes a flow passage in the central IPA supply pipe 57 is interposed in the central IPA supply pipe 57.

In the present preferred embodiment, the central IPA nozzle 11 is configured to supply the IPA. The central IPA nozzle 11 only needs to function as a central low surface tension liquid nozzle that supplies a low surface tension liquid with lower surface tension than water to the center region of the upper surface of the substrate W.

As the low surface tension liquid, an organic solvent other than the IPA, which does not chemically react (or has low reactivity) with the upper surface of the substrate W and the pattern formed on the substrate W (refer to FIG. 9) can be used. More specifically, a liquid including at least one of the IPA, HFE (hydrofluoroether), methanol, ethanol, acetone, and trans-1,2-dichloroethylene can be used as the low surface tension liquid. In addition, the low surface tension liquid does not need to be composed of a single component only, but may be a liquid mixture with other components. For example, the low surface tension liquid may be a mixture of an IPA solution and purified water, or a mixture of an IPA liquid and an HFE liquid.

The inert gas such as the nitrogen gas is supplied from an inert gas supply source to the inert gas nozzle 12 via a first inert gas supply pipe 59. A first inert gas valve 60 that opens and closes a flow passage of the first inert gas supply pipe 59 is interposed in the first inert gas supply pipe 59. The inert gas is a gas which is inert to the upper surface of the substrate W and the pattern. The inert gas is not limited to the nitrogen gas but may be a rare gas such as argon, for example.

By a space between an outer peripheral surface of the nozzle housing member 35, and a surface partitioning the communicating hole 6b in the shielding plate 6 and an inner peripheral surface of the hollow shaft 30, an inert gas flow channel 18 through which the inert gas is supplied to the center region of the substrate W is formed. The inert gas such as the nitrogen gas is supplied from an inert gas supply source to the inert gas flow channel 18 via a second inert gas supply pipe 66. A second inert gas valve 67 that opens and closes a flow passage of the second inert gas supply pipe 66 is interposed in the second inert gas supply pipe 66. The inert gas supplied to the inert gas flow channel 18 is discharged from the lower end of the communicating hole 6b toward the upper surface of the substrate W.

The processing unit 2 may further include a moving nozzle 17 that supplies a processing liquid to the upper surface of the substrate W (refer to FIG. 2). The moving nozzle 17 is moved in the vertical direction and the horizontal direction by a moving nozzle moving mechanism 65. The processing liquid supplied from the moving nozzle 17 to the substrate W is, for example, a chemical liquid, a rinse liquid, a low surface tension liquid, etc.

The processing unit 2 further includes an IPA nozzle 13 and an IPA nozzle moving mechanism 14. The IPA nozzle 13 extends from the inner wall of the first guard 43 so as to be disposed in the space A in a state where the space A is formed, and supplies the IPA to the upper surface of the substrate W. The IPA nozzle moving mechanism 14 is coupled to the first guard 43 and moves the IPA nozzle 13 between the upper surface of the substrate W and the facing surface 6a of the shielding plate 6.

The IPA nozzle 13 extends from the inner wall of the first guard 43 to the inner side of the space A in a state where the space A is formed. The IPA nozzle 13 is an example of a processing liquid supply nozzle that supplies the processing liquid to the upper surface of the substrate W.

The IPA is supplied from an IPA supply source to the IPA nozzle 13 via an IPA supply pipe 61. An IPA valve 62 that opens and closes a flow passage in the IPA supply pipe 61 is interposed in the IPA supply pipe 61.

The IPA nozzle 13 extends in the horizontal direction and is curved in plan view. In detail, the IPA nozzle 13 has an arc shape following the first cylindrical portion 43A of the first guard 43. A discharge port 13a that discharges the IPA toward the upper surface of the substrate W in the vertical direction (downward) is provided in the tip of the IPA nozzle 13.

The IPA nozzle 13 is moved between a center position and a retreat position by movement in the horizontal direction. When the IPA nozzle 13 is positioned at the center position, the IPA nozzle 13 faces the rotation center position of the upper surface of the substrate W. When the IPA nozzle 13 is positioned at the retreat position, the IPA nozzle 13 does not face the upper surface of the substrate W. The retreat position is a position on the outer side of the spin base 21 in plan view. More specifically, when the IPA nozzle 13 is positioned at the retreat position, the IPA nozzle 13 may be adjacent to the first cylindrical portion 43A of the first guard 43 from the radially inner side.

The IPA nozzle moving mechanism 14 is an example of a nozzle moving unit that moves the IPA nozzle 13 (processing liquid supply nozzle) between the upper surface of the substrate W and the facing surface 6a. The IPA nozzle moving mechanism 14 includes a nozzle support member 15, a driving mechanism 16, and a cover 73. The nozzle support member 15 supports the IPA nozzle 13. The driving mechanism 16 is coupled to the first guard 43 and drives the nozzle support member 15. The cover 73 covers at least a portion of the driving mechanism 16. The driving mechanism 16 includes a rotating shaft (not shown) and a driving motor (not shown) that rotates the rotating shaft. The nozzle support member 15 has the form of a rotating shaft that is driven by the driving motor to rotate around a prescribed central axis.

The upper end of the nozzle support member 15 is positioned higher than the cover 73. The IPA nozzle 13 and the nozzle support member 15 may be formed integrally. The nozzle support member 15 and the IPA nozzle 13 have the form of hollow shafts. The interior space of the nozzle support member 15 and the interior space of the IPA nozzle 13 communicate with each other. The IPA supply pipe 61 is inserted through the nozzle support member 15 from the upper side.

The first extension portion 43B of the first guard 43 integrally includes an inclined section 43C that is inclined with respect to the horizontal direction, and a flat section 43D that is flat in the horizontal direction. The flat section 43D and the inclined section 43C are disposed side by side in the rotational direction of the substrate W. The flat section 43D projects higher than the inclined section 43C such that the flat section is positioned higher than the inclined section 43C as the flat section 43D approaches the radially outer side. The flat section 43D is disposed so as to overlap with the nozzle support member 15 and with the IPA nozzle 13 that is positioned on the outer side of the spin base 21 in plan view. The flat section 43D only needs to be disposed so as to overlap at least with the IPA nozzle 13 at the retreat position and the nozzle support member 15 in plan view.

The second extension portion 44B of the second guard 44 faces the flat section 43D from the lower side. The second extension portion 44B is an example of a facing portion that extends so as to be inclined with respect to the horizontal direction and faces the flat section 43D from the lower side.

Between the first guard 43 and the second guard 44, a housing space B where the IPA nozzle 13 can be housed is formed. The housing space B extends in the rotational direction of the substrate W following the first cylindrical portion 43A of the first guard 43, and has an arc shape in plan view. The housing space B is a space partitioned by the first cylindrical portion 43A, the flat section 43D, and the second extension portion 44B. In detail, the housing space B is partitioned from the radially outer side by the first cylindrical portion 43A, partitioned from the upper side by the flat section 43D, and partitioned from the lower side by the second extension portion 44B. When the IPA nozzle 13 is positioned at the retreat position, the IPA nozzle 13 is close to the flat section 43D from the lower side in a state where being housed in the housing space B.

The flat section 43D is flat in the horizontal direction and the second extension portion 44B is inclined with respect to the horizontal direction so as to rise upward as the second extension portion 44B approaches the radially inner side. Therefore, even in a state where the radially inner end of the second extension portion 44B is the closest to the radially inner end of the first extension portion 43B of the first guard 43, the housing space B is formed between the first guard 43 and the second guard 44.

A penetrating hole 43b that penetrates the flat section 43D in the vertical direction Z is formed in the flat section 43D of the first guard 43. The nozzle support member 15 is inserted through the penetrating hole 43b. A sealing member made of rubber, etc., (not shown) is disposed between the nozzle support member 15 and the inner wall of the penetrating hole 43b. Thereby, a region between the nozzle support member 15 and the inner wall of the penetrating hole 43b is sealed. The driving mechanism 16 is disposed outside the space A.

The processing unit 2 further includes a first bracket 70, a pedestal 71, and a second bracket 72. The first bracket 70 is attached to the first guard raising/lowering mechanism 46 and fixes the IPA nozzle moving mechanism 14 to the first guard 43. The pedestal 71 is supported by the first bracket 70 and the driving mechanism 16 is mounted on and fixed to the pedestal 71. The second bracket 72 is coupled to the first guard 43 and supports the pedestal 71 on the radially inner side of the first bracket 70 in the substrate W. In the IPA nozzle moving mechanism 14, a portion 14a fixed by the first bracket 70 overlaps with the first guard raising/lowering mechanism 46 in plan view.

Figure 5:
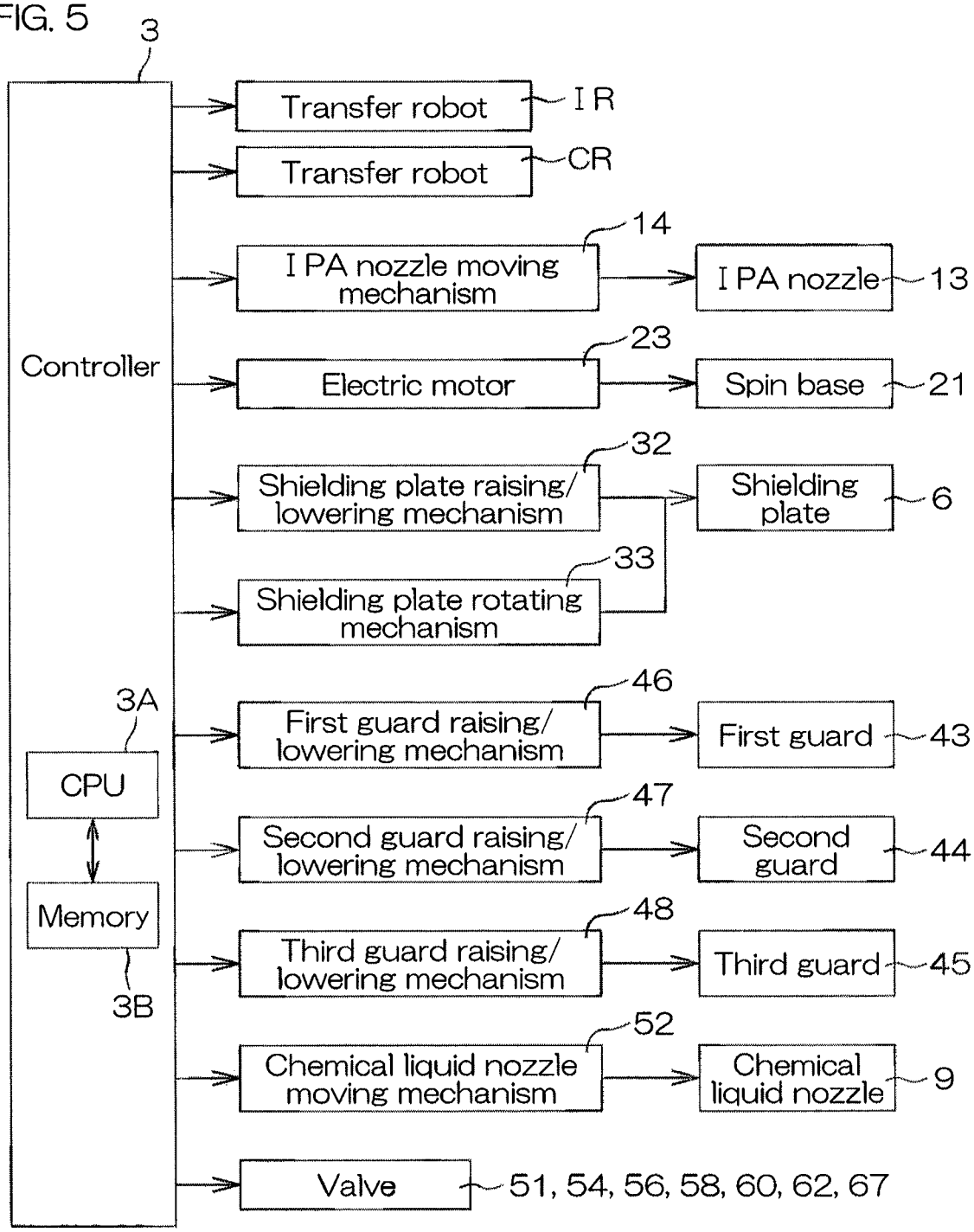
FIG. 5 is a block diagram for explaining an electrical configuration of the main portion of the substrate processing apparatus.

FIG. 5 is a block diagram for explaining an electrical configuration of the main portion of the substrate processing apparatus 1. The controller 3 includes a microcomputer, and controls control objects provided in the substrate processing apparatus 1 according to a prescribed control program. More specifically, the controller 3 includes a processor (CPU) 3A and a memory 3B in which the program is stored. The controller is configured to execute various controls for substrate processing by the processor 3A executing the program. In particular, the controller 3 controls actions of the transfer robots IR and CR, the IPA nozzle moving mechanism 14, the electric motor 23, the shielding plate raising/lowering mechanism 32, the shielding plate rotating mechanism 33, the guard raising/lowering mechanisms 46 to 48, the chemical liquid nozzle moving mechanism 52, and the valves 51, 54, 56, 58, 60, 62, 67, etc.

Figure 6:
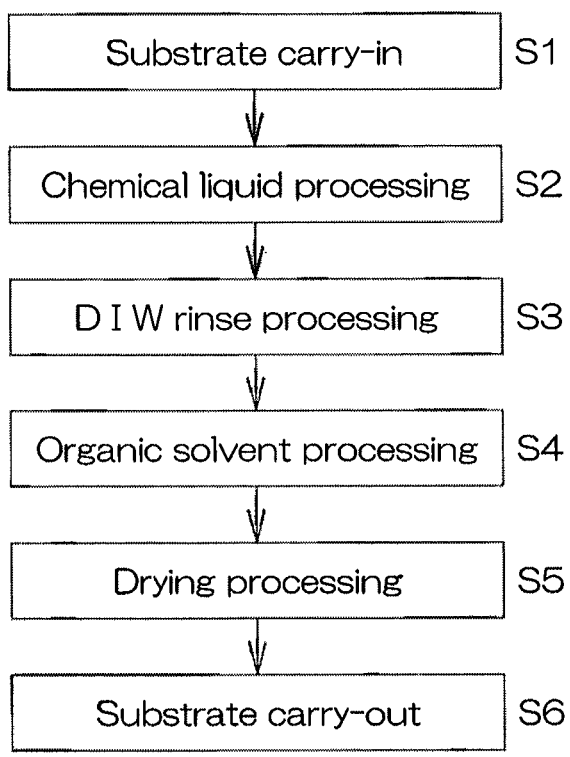
FIG. 6 is a flowchart for explaining an example of substrate processing performed by the substrate processing apparatus.

FIG. 6 is a flowchart for explaining an example of substrate processing performed by the substrate processing apparatus 1. The figure mainly shows processing to be realized by the controller 3 executing the program. FIG. 7 is a time chart for explaining the details of substrate processing. FIG. 8A to FIG. 8G are illustrative sectional views of the main portion of the processing unit 2 for explaining the details of substrate processing.

In substrate processing by the substrate processing apparatus 1, carry-in of a substrate (S1), chemical liquid processing (S2), DIW rinse processing (S3), organic solvent processing (S4), drying processing (S5), and carry-out of the substrate (S6) are executed in this order as shown in FIG. 6, for example.

First, in substrate processing by the substrate processing apparatus 1, an unprocessed substrate W is carried from the carrier C into the processing unit 2 and delivered to the spin chuck 5 by the transfer robots IR and CR (S1). Then, the substrate W is held horizontally by the spin chuck 5 until the substrate W is carried out by the transfer robot CR (substrate holding step). In a state where the substrate W is held horizontally by the spin chuck 5, the upper surface of the substrate W faces the facing surface 6a of the shielding plate 6. A state where the facing surface 6a of the shielding plate 6 is disposed such that the facing surface 6a faces the upper surface of the substrate is maintained until the substrate W is carried out by the transfer robot CR (facing-disposing step).

Next, with reference to FIG. 7 and FIG. 8A, the chemical liquid processing (S2) will be described. After the transfer robot CR is retreated to the outside of the processing unit 2, the chemical liquid processing (S2) in which the upper surface of the substrate W is cleaned with the chemical liquid is executed.

Specifically, the controller 3 first controls the IPA nozzle moving mechanism 14 to position the IPA nozzle 13 at the retreat position. In a state where the IPA nozzle 13 is disposed at the retreat position, the controller 3 controls the first guard raising/lowering mechanisms 46 and the second guard raising/lowering mechanisms 47 to bring the first guard 43 and the second guard 44 close to each other in the vertical direction Z, dispose the first guard 43 at the higher position, and dispose the second guard 44 higher than the substrate facing position. Thereby, the IPA nozzle 13 is housed in the housing space B partitioned by the flat section 43D of the first extension portion 43B of the first guard 43, the first cylindrical portion 43A of the first guard 43, and the second extension portion 44B of the second guard 44.

Then, the controller 3 controls the third guard raising/lowering mechanisms 48 to dispose the third guard 45 higher than the substrate facing position. In addition, the controller 3 controls the shielding plate raising/lowering mechanism 32 to dispose the shielding plate 6 at the higher position.

Then, the controller 3 drives the electric motor 23 to rotate the spin base 21 at 800 rpm, for example. Then, the controller 3 controls the shielding plate rotating mechanism 33 to rotate the shielding plate 6. At this time, the shielding plate 6 may be rotated in synchronization with the spin base 21. The phrase "rotated in synchronization" means rotations in the same direction at the same rotational speed.

Then, the controller 3 controls the chemical liquid nozzle moving mechanism 52 to dispose the chemical liquid nozzle 9 at a chemical liquid processing position above the substrate W. The chemical liquid processing position may be a position where the chemical liquid discharged from the chemical liquid nozzle 9 is landed on the rotation center of the upper surface of the substrate W. The controller 3 opens the chemical liquid valve 54. Thereby, the chemical liquid is supplied from the chemical liquid nozzle 9 toward the upper surface of the substrate W which is in a rotating state. The supplied chemical liquid is spread over the entire upper surface of the substrate W by centrifugal force. At this time, the amount of the chemical liquid supplied from the chemical liquid nozzle 9 (chemical liquid supply amount) is 2 liter/min, for example.

The chemical liquid splashed outside the substrate by centrifugal force (refer to bold arrows on the side of the substrate W) passes under the third extension portion 45B of the third guard 45, and is received by the third cylindrical portion 45A of the third guard 45. The chemical liquid received by the third cylindrical portion 45A flows to the first cup 41 (refer to FIG. 3).

At this time, the IPA nozzle 13 is housed in the housing space B. Therefore, fouling of the IPA nozzle 13 due to the chemical liquid splashed from the upper surface of the substrate W can be suppressed or prevented.

In the present preferred embodiment, the chemical liquid splashed outside the substrate by centrifugal force is received by the third cylindrical portion 45A of the third guard 45. However, unlike the present preferred embodiment, the chemical liquid splashed outside the substrate W by centrifugal force may be received by the second cylindrical portion 44A of the second guard 44. In this case, the controller 3 controls the guard raising/lowering mechanisms 46 to 48 to move the guards 43 to 45 such that the chemical liquid splashed outside the substrate W by centrifugal force passes through a region between the second extension portion 44B of the second guard 44 and the third extension portion 45B of the third guard 45 and is received by the second cylindrical portion 44A of the second guard 44. Specifically, the second guard 44 is disposed higher than the substrate facing position, and the third guard 45 is disposed lower than the substrate facing position. The chemical liquid received by the second cylindrical portion 44A flows to the second cup 42 (refer to FIG. 3).

Next, the DIW rinse processing (S3) will be described with reference to FIG. 7, FIG. 8B, and FIG. 8C.

After the chemical liquid processing (S2) for a fixed time period, the DIW rinse processing (S3) in which the chemical liquid on the substrate W is replaced with the DIW to remove the chemical liquid from the upper surface of the substrate W is executed.

Figure 8B:
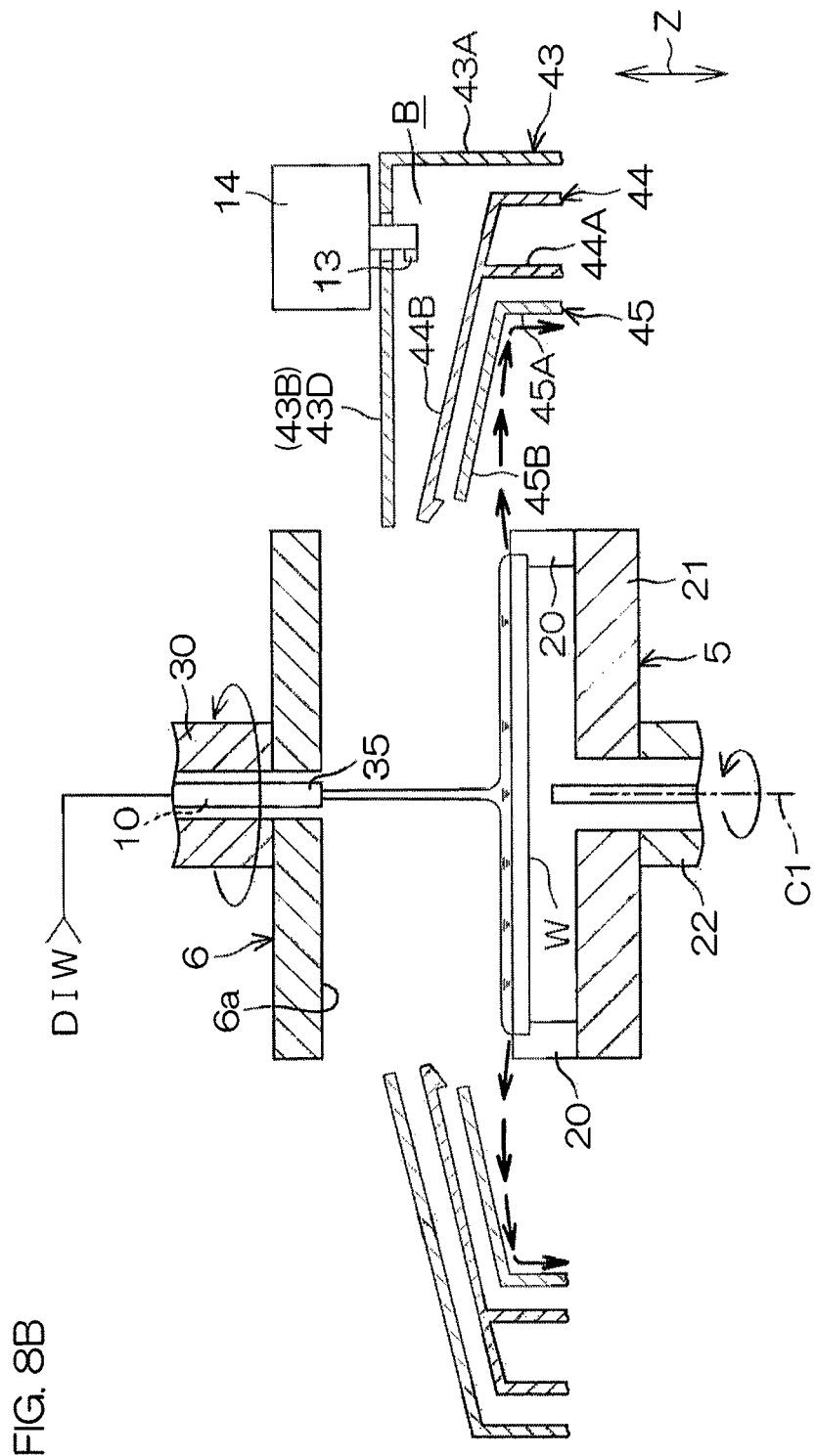

Specifically, the controller 3 first closes the chemical liquid valve 54 with reference to FIG. 7 and FIG. 8B. Then, the controller 3 controls the chemical liquid nozzle moving mechanism 52 to retreat the chemical liquid nozzle 9 from the upper side of the substrate W to the side of the spin base 21.

Then, the controller 3 opens the DIW valve 56. Thereby, the DIW is supplied from the DIW nozzle 10 toward the upper surface of the substrate W which is in a rotating state. The DIW supplied to the upper surface of the substrate W is spread over the entire upper surface of the substrate W by centrifugal force. The chemical liquid on the substrate W is washed off by the DIW. At this time, the amount of the DIW supplied from the DIW nozzle 10 (DIW supply amount) is 2 liter/min, for example.

Then, the controller 3 controls the guard raising/lowering mechanisms 46 to 48 to maintain the housing space B in a state where the second guard 44 is disposed higher than the substrate facing position, and maintain the third guard 45 higher than the substrate facing position. In this state, the IPA nozzle 13 positioned at the retreat position is housed in the housing space B. In addition, the controller 3 controls the shielding plate raising/lowering mechanism 32 to maintain the shielding plate 6 at the higher position.

Then, the controller 3 drives the electric motor 23 to rotate the spin base 21 at 800 rpm, for example. The controller 3 controls the shielding plate rotating mechanism 33 to rotate the shielding plate 6. At this time, the shielding plate 6 may be rotated in synchronization with the spin base 21.

The chemical liquid and the DIW splashed outside the substrate W by centrifugal force (refer to bold arrows on the side of the substrate W) passes under the third extension portion 45B of the third guard 45, and is received by the third cylindrical portion 45A of the third guard 45. The DIW received by the third cylindrical portion 45A flows to the first cup 41 (refer to FIG. 3). At this time, the IPA nozzle 13 is housed in the housing space B. Therefore, fouling of the IPA nozzle 13 due to the chemical liquid and the DIW splashed from the upper surface of the substrate W can be suppressed or prevented.

Figure 8C:
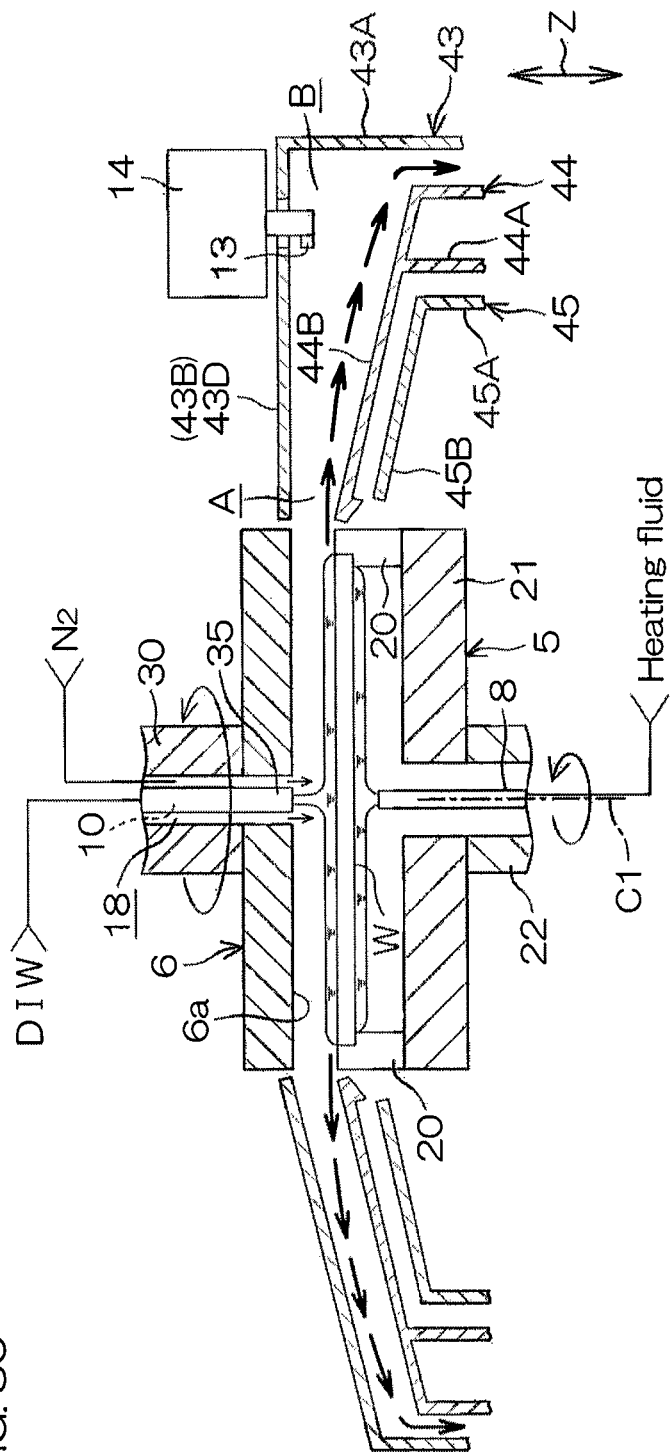

Then, with reference to FIG. 7 and FIG. 8C, in a state where the DIW is supplied from the DIW nozzle 10 toward the upper surface of the substrate W which is in a rotating state, the controller 3 controls the shielding plate raising/lowering mechanism 32 to move the shielding plate 6 from the higher position to a first proximal position. The first proximal position is a position of the shielding plate 6, where the facing surface 6a of the shielding plate 6 comes close to the upper surface of the substrate W. When the shielding plate 6 is positioned at the first proximal position, a distance between the upper surface of the substrate W and the facing surface 6a is 7 mm, for example.

Then, the controller 3 controls the first guard raising/lowering mechanisms 46 to lower the first guard 43, so that the first guard 43 is disposed at the shielding plate facing position. Thereby, the space A is formed by the substrate W, the shielding plate 6, and the first guard 43 (space forming step). In addition, the controller 3 controls the second guard raising/lowering mechanisms 47 to lower the second guard 44, so that the second guard 44 is disposed at the substrate facing position. Thereby, the space A is partitioned by the second extension portion 44B of the second guard 44 from the lower side.

Then, the controller 3 controls the second inert gas valve 67, so that a flow rate of the inert gas supplied from the inert gas flow channel 18 is 300 liter/min, for example. Thereby, the inert gas is supplied to the space A by the inert gas flow channel 18 (inert gas supplying step), and the atmosphere in the space A is replaced with the inert gas (inert gas replacing step). The inert gas flow channel 18 functions as an inert gas supply unit that supplies the inert gas to the space A for replacing the atmosphere in the space A with the inert gas.

Then, the controller 3 opens the heating fluid valve 51 to supply the heating fluid from the lower surface nozzle 8, so that the substrate W is heated (substrate heating step).

The controller 3 controls the electric motor 23 to rotate the spin base 21 at 1,200 rpm, for example, and maintain the rotation for a prescribed time period, and then accelerate the rotation of the spin base 21 to 2,000 rpm, for example (high-speed rotation step).

The controller 3 controls the shielding plate rotating mechanism 33 to rotate the shielding plate 6 at a speed different from the spin base 21. Specifically, the shielding plate 6 is rotated at 800 rpm, for example.

The chemical liquid and the DIW splashed outside the substrate W by centrifugal force (refer to bold arrows on the side of the substrate W) pass between the first extension portion 43B of the first guard 43 and the second extension portion 44B of the second guard 44, and are received by the first cylindrical portion 43A of the first guard 43.

As described above, the flat section 43D partitioning the housing space B from the upper side projects higher than the inclined section 43C. As described above, the IPA nozzle 13 positioned at the retreat position is adjacent to the flat section 43D from the lower side. Therefore, in comparison to the configuration where the IPA nozzle 13 positioned at the retreat position is adjacent to the inclined section 43C from the lower side, fouling of the IPA nozzle 13 due to passage of the chemical liquid and the DIW splashed from the upper surface of the substrate W between the first extension portion 43B and the second extension portion 44B can be suppressed.

In the present preferred embodiment, the chemical liquid and the DIW splashed outside the substrate by centrifugal force is received by the first cylindrical portion 43A of the first guard 43. However, unlike the present preferred embodiment, the chemical liquid and the DIW splashed outside the substrate by centrifugal force may be received by the second cylindrical portion 44A of the second guard 44. In this case, the controller 3 controls the guard raising/lowering mechanisms 46 to 48 to dispose the second guard 44 higher than the substrate facing position and dispose the third guard 45 lower than the substrate facing position.

Next, with reference to FIG. 7 and FIG. 8D to FIG. 8F, the organic solvent processing (S4) will be described. After the DIW rinse processing (S3) for a fixed time period, the organic solvent processing (S4) in which the DIW on the substrate W is replaced with an organic solvent (such as the IPA) serving as a low surface tension liquid with lower surface tension than water is executed. While the organic solvent processing is being executed, the substrate W may be heated. Specifically, the controller 3 maintains a state where the heating fluid valve 51 is opened and supplies the heating fluid from the lower surface nozzle 8, so that the substrate W is continuously heated.

Figure 8D:
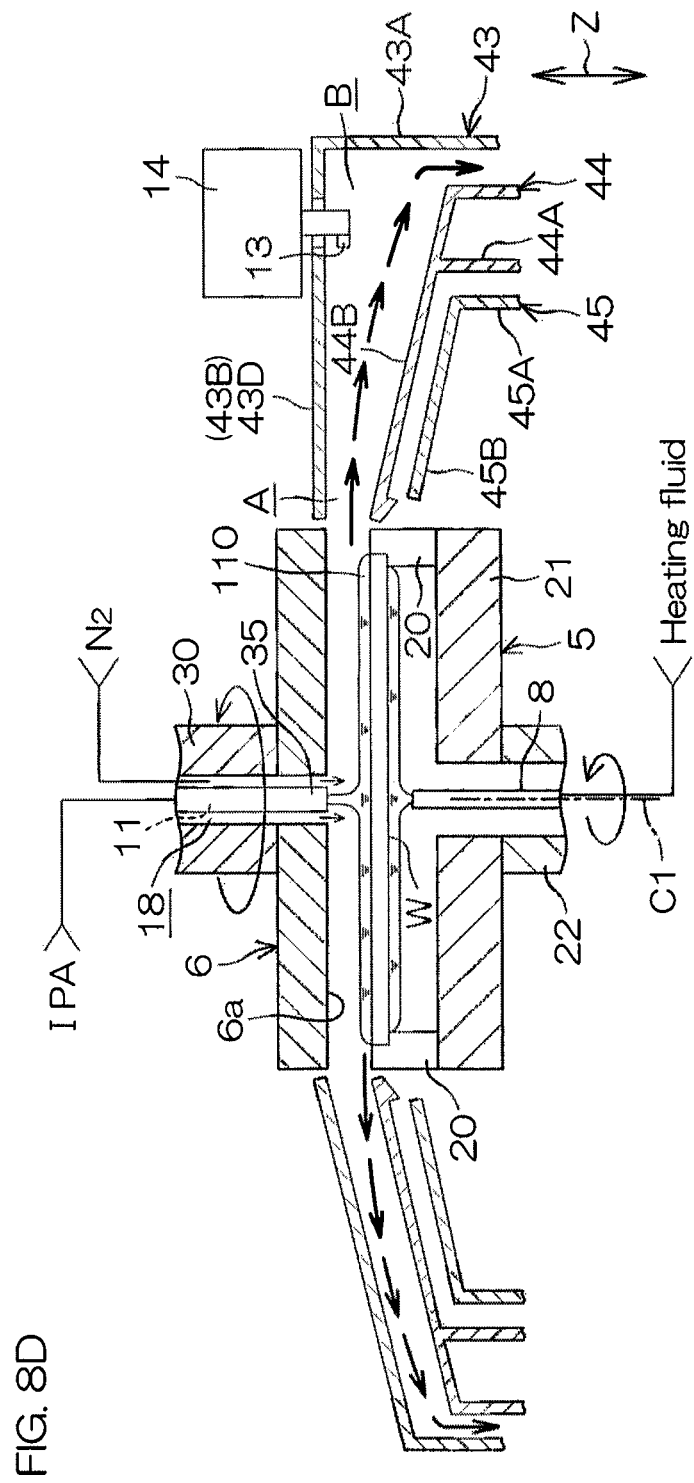

With reference to FIG. 7 and FIG. 8D, in the organic solvent processing, a high-speed IPA replacement step S4a of replacing the DIW on the upper surface of the substrate W with the IPA in a state where the substrate W is rotated at a high speed is first executed.

When the high-speed IPA replacement step S4a is started, the controller 3 closes the DIW valve 56. Thereby, supply of the DIW from the DIW nozzle 10 is interrupted. The controller 3 opens the central IPA valve 58. Thereby, the IPA is supplied from the central IPA nozzle 11 toward the upper surface of the substrate W which is in a rotating state, and a liquid film 110 of the IPA is formed on the upper surface of the substrate W (liquid film forming step).

The controller 3 controls the shielding plate raising/lowering mechanism 32 to maintain a state where the shielding plate 6 is disposed at the first proximal position. The controller 3 controls the first guard raising/lowering mechanisms 46 to maintain a state where the first guard 43 is disposed at the shielding plate facing position. The controller 3 controls the second guard raising/lowering mechanisms 47 to maintain a state where the second guard 44 is disposed at the substrate facing position. Thereby, the space A is formed by the substrate W, the shielding plate 6, and the first guard 43, and a state where the space A is partitioned by the second extension portion 44B of the second guard 44 from the lower side is maintained. Unlike the present preferred embodiment, when the second guard 44 is positioned higher than the substrate facing position when the DIW rinse processing (S3) is ended, the controller 3 controls the second guard raising/lowering mechanisms 47 to move the second guard 44 to the substrate facing position before the high-speed IPA replacement step S4a is started.

The controller 3 controls the second inert gas valve 67, so that the flow rate of the inert gas supplied from the inert gas flow channel 18 is 50 liter/min, for example.

The controller 3 drives the electric motor 23 to rotate the spin base 21 at a high speed of 2,000 rpm, for example (high-speed rotation step). That is, the high-speed rotation step is executed following the DIW rinse processing (S3). The supplied IPA is rapidly spread over the entire upper surface of the substrate W by centrifugal force, and the DIW on the substrate W is replaced with the IPA.

The controller 3 controls the shielding plate rotating mechanism 33 to rotate the shielding plate 6 at 1,000 rpm, for example.

The DIW and the IPA splashed outside the substrate by centrifugal force (refer to bold arrows on the side of the substrate W) pass between the first extension portion 43B of the first guard 43 and the second extension portion 44B of the second guard 44, and are received by the first cylindrical portion 43A of the first guard 43.

As described above, the flat section 43D partitioning the housing space B from the upper side projects higher than the inclined section 43C. As described above, the IPA nozzle 13 positioned at the retreat position is adjacent to the flat section 43D from the lower side. Therefore, in comparison to the configuration where the IPA nozzle 13 positioned at the retreat position is adjacent to the inclined section 43C from the lower side, fouling of the IPA nozzle 13 due to passage of the DIW and the IPA splashed from the upper surface of the substrate W between the first extension portion 43B and the second extension portion 44B can be suppressed.

Figure 8E:
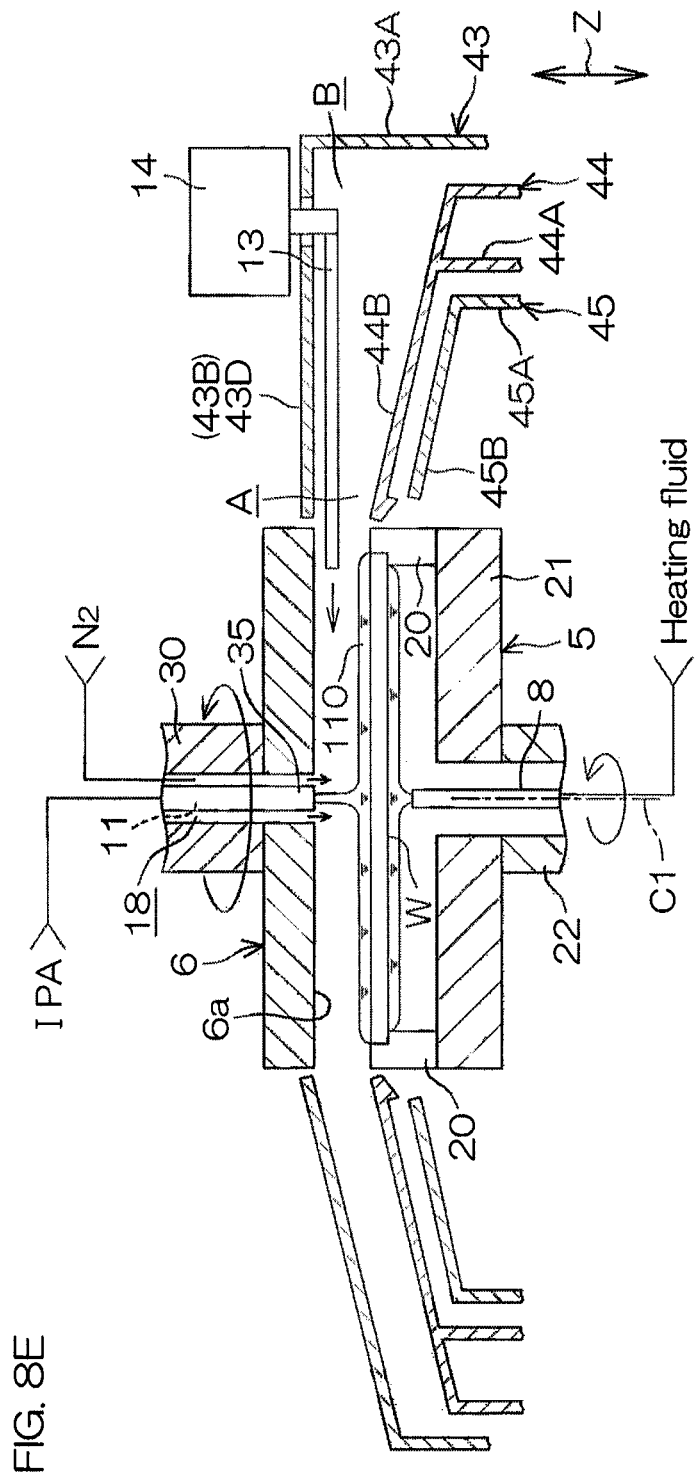

With reference to FIG. 8E, in the organic solvent processing (S4), next to the high-speed IPA replacement step S4a, an interval adjustment step S4b of adjusting an interval between the upper surface of the substrate W and the facing surface 6a of the shielding plate 6 by moving (raising) the shielding plate 6 is executed.

The controller 3 controls the electric motor 23 to maintain a state where the spin base 21 is rotated at a high speed of 2,000 rpm, for example (high-speed rotation step). In addition, the controller 3 controls the shielding plate rotating mechanism 33 to maintain a state where the shielding plate 6 is rotated at 1,000 rpm, for example.

The controller 3 controls the shielding plate raising/lowering mechanism 32 to move (raise) the shielding plate 6 from the first proximal position to a second proximal position while maintaining the space A, so that the interval between the upper surface of the substrate W and the facing surface 6a of the shielding plate 6 is adjusted (interval adjustment step S4b). The second proximal position is a position of the shielding plate 6, where the facing surface 6a of the shielding plate 6 comes close to the upper surface of the substrate W. The second proximal position is a position higher than the first proximal position. The facing surface 6a of the shielding plate 6 positioned at the second proximal position is positioned higher than the facing surface 6a of the shielding plate 6 positioned at the first proximal position. A distance between the facing surface 6a of the shielding plate 6 positioned at the second proximal position and the upper surface of the substrate W is about 15 mm.

At the time of the interval adjustment step S4b, the controller 3 controls the first guard raising/lowering mechanisms 46 to move (raise) the first guard 43 together with the shielding plate 6 at the same speed at the same time with respect to the substrate W, so that the first guard 43 is disposed at the shielding plate facing position. Thereby, before and after the interval adjustment step S4b, a state where the space A is formed is maintained. Then, the controller 3 controls the second guard raising/lowering mechanisms 47 to maintain a state where the second guard 44 is disposed at the substrate facing position.

The interval adjustment step S4b only needs to maintain a state where movement of the atmosphere between the space A and the outside is restricted. That is, in the interval adjustment step S4b, a state where the first guard 43 is positioned at the shielding plate facing position is not necessarily continuously maintained. As long as the state where the movement of the atmosphere between the space A and the outside of the space A is restricted can be maintained, a state may temporarily occur where the first guard 43 is disposed at a position slightly displaced from the shielding plate facing position in the vertical direction Z in the middle of the interval adjustment step S4b. Also, when the state where the movement of the atmosphere between the space A and the outside of the space A is restricted is maintained, there is no need for raising/lowering the first guard 43 together with the shielding plate 6 at the same speed and there is also no need for raising/lowering the shielding plate 6 and the first guard 43 at the same time.

By positioning the shielding plate 6 at the second proximal position, the IPA nozzle 13 can be moved between the substrate W and the shielding plate 6. That is, the interval adjustment step S4b includes a step of adjusting the interval between the upper surface of the substrate W and the facing surface 6a of the shielding plate 6 such that the IPA nozzle 13 can be moved between the upper surface of the substrate W and the facing surface 6a of the shielding plate 6.

During a period of time in which the liquid film 110 of the IPA is held on the substrate W, a nozzle moving step S4c that the controller 3 controls the IPA nozzle moving mechanism 14 to move the IPA nozzle 13 toward a processing position, is executed. The processing position is a position slightly (by about 40 mm, for example) displaced from the center region of the substrate W to the peripheral edge side of the substrate W.

The controller 3 reduces the rotational speed of the substrate W to 300 rpm at the same time as start of the nozzle moving step S4c. Thereby, the liquid amount of the IPA splashed from the substrate W is reduced. Meanwhile, the controller 3 maintains the rotational speed of the shielding plate 6 at 1,000 rpm, for example.

In the present preferred embodiment, when the shielding plate 6 is positioned at least higher than the second proximal position, the IPA nozzle 13 is movable between the facing surface 6a of the shielding plate 6 and the upper surface of the substrate W. However, unlike the present preferred embodiment, when the shielding plate 6 is positioned at the first proximal position lower than the second proximal position, the IPA nozzle 13 may be movable between the facing surface 6a of the shielding plate 6 and the upper surface of the substrate W. In this case, the interval between the upper surface of the substrate W and the facing surface 6a of the shielding plate 6 is adjusted so that the IPA nozzle 13 can be moved between the upper surface of the substrate W and the facing surface 6a of the shielding plate 6 at the same time as the shielding plate 6 is moved to the first proximal position and the space A is formed. That is, the space forming step and the interval adjustment step S4b (interval adjusting step) are executed at the same time.

In the organic solvent processing (S4), supply of the inert gas from the inert gas flow channel 18 started in the DIW rinse processing (S3) is maintained. Therefore, since the inert gas supplying step is already started in the DIW rinse processing (S3), the inert gas supplying step is started before the interval adjustment step S4b (interval adjusting step) is ended.

Figure 8F:
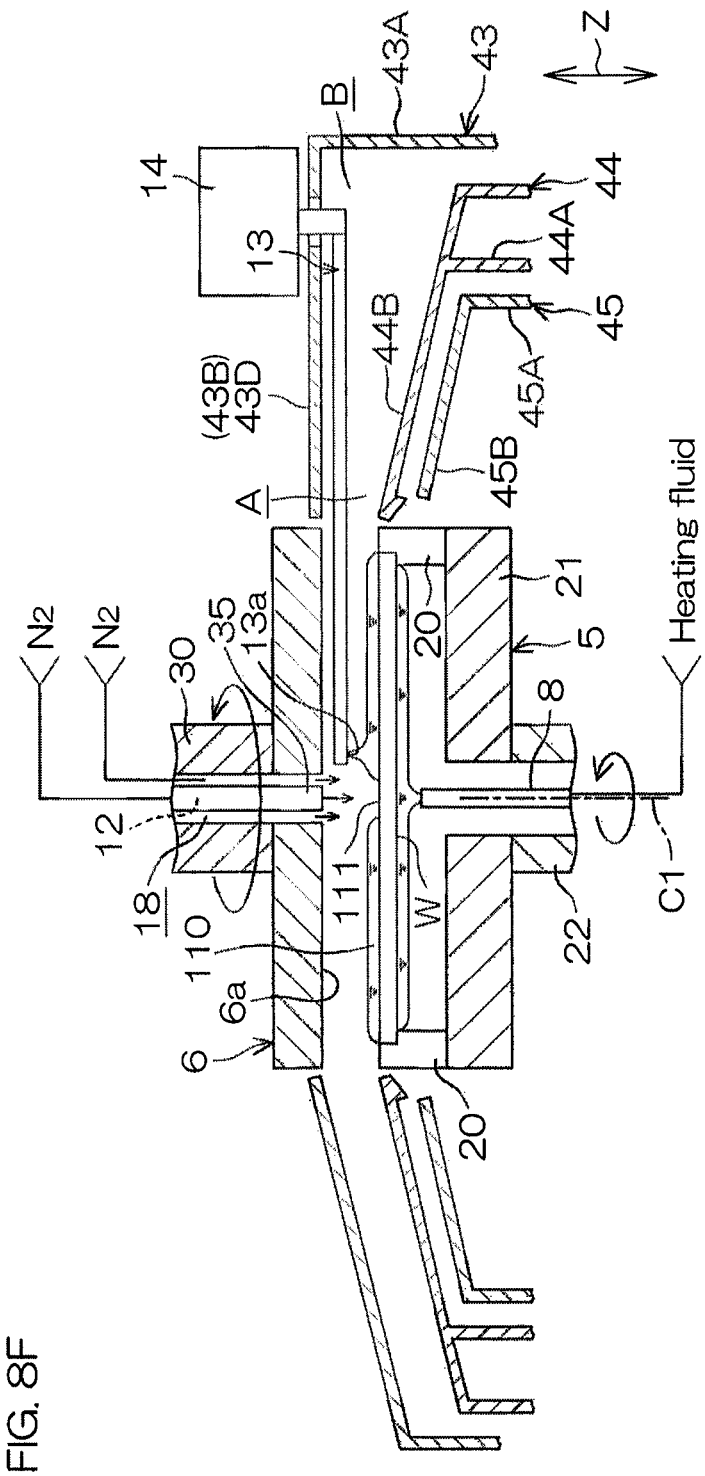

With reference to FIG. 8F, when the nozzle moving step S4c is ended and the IPA nozzle 13 is moved to the processing position, a liquid film removing step S4d of removing the liquid film 110 of the IPA on the upper surface of the substrate W is executed.

The controller 3 first closes the central IPA valve 58 to interrupt supply of the IPA to the upper surface of the substrate W by the central IPA nozzle 11. Then, the controller 3 controls the second inert gas valve 67 to blow the inert gas (for example, a N2 gas) perpendicularly from the inert gas flow channel 18 toward the center region of the upper surface of the substrate W at 100 liter/min, for example. Thereby, a small opening 111 (having a diameter of about 30 mm, for example) is formed in a center region of the liquid film 110, so that the center region of the upper surface of the substrate W is exposed.

In the liquid film removing step S4d, the opening 111 may be formed by methods other than blowing of the inert gas. For example, the opening 111 may be formed in the center region of the liquid film 110 by heating the substrate W by supply of the heating fluid from the lower surface nozzle 8 to the center region of the lower surface of the substrate W and evaporating the IPA of the center region. Alternatively, the opening 111 may also be formed in the liquid film 110 by both blowing the inert gas to the upper surface of the substrate W and heating the center region of the lower surface of the substrate W by the heating fluid.

The opening 111 is widened by centrifugal force due to rotation of the substrate W, and the IPA liquid film is gradually removed from the upper surface of the substrate W. Blowing of the inert gas from the inert gas flow channel 18 may be continued until the liquid film 110 is removed from the upper surface of the substrate W. That is, blowing of the inert gas may be continued until the liquid film removing step is ended. By blowing force of the inert gas, force is applied to the IPA liquid film 110 and widening of the opening 111 is promoted. During this time, the flow rate of the inert gas may be increased in a stepwise manner. For example, in the present preferred embodiment, the inert gas flow rate is maintained at 100 liter/min for a prescribed time period, then increased to 200 liter/min and maintained for a prescribed time period, and then increased to 300 liter/min and maintained for a prescribed time period.

At this time, the controller 3 may control the first inert gas valve 60 to supply the inert gas also from the inert gas nozzle 12 to the center region of the upper surface of the substrate W. Thereby, widening of the opening 111 is further promoted.

When the opening 111 is widened, the controller 3 controls the IPA valve 62 to start supply of the IPA from the IPA nozzle 13 to the upper surface of the substrate W. A temperature of the IPA supplied from the IPA nozzle 13 is preferably higher than the room temperature, such as 50° C.

During this time, the controller 3 sets a liquid landing point of the IPA supplied from the IPA nozzle 13 on the outer side of the opening 111. The outer side of the opening 111 is the side opposite to the rotational axis C1 with respect to the peripheral edge of the opening 111.

In accordance with widening of the opening 111, the controller 3 controls the IPA nozzle moving mechanism 14 to move the IPA nozzle 13 toward the peripheral edge of the substrate W. Thereby, a sufficient amount of the IPA is supplied to the liquid film 110. Therefore, local loss of the IPA further outward than the peripheral edge of the opening 111 due to evaporation or centrifugal force can be suppressed. The organic solvent processing (S4) (liquid film removing step S4d) is ended, for example, when the IPA nozzle 13 reaches an outer peripheral position. When the IPA nozzle 13 is positioned at the outer peripheral position, an IPA supply position where the IPA is supplied to the liquid film 110 by the IPA nozzle 13 reaches the peripheral edge of the substrate W. When the IPA nozzle 13 is positioned at the outer peripheral position, the IPA supply position is displaced from the center region of the substrate W to the peripheral edge side of the substrate W by 140 mm, for example. Alternatively, the organic solvent processing (S4) may be ended when the peripheral edge of the opening 111 reaches the peripheral edge of the substrate W.

Next, the drying processing (S5) will be described with reference to FIG. 8G. After the organic solvent processing (S4) is ended, the drying processing (S5: spin drying) for spinning off a liquid component on the upper surface of the substrate W by centrifugal force is executed.

Specifically, the controller 3 closes the heating fluid valve 51, the IPA valve 62, and the first inert gas valve 60. The controller 3 controls the IPA nozzle moving mechanism 14 to retreat the IPA nozzle 13 to the retreat position.

Then, the controller 3 controls the shielding plate raising/lowering mechanism 32 to move the shielding plate 6 to the lower position. Then, the controller 3 controls the second guard raising/lowering mechanisms 47 and the third guard raising/lowering mechanisms 48 to dispose the second guard 44 and the third guard 45 lower than the substrate facing position. Then, the controller 3 controls the first guard raising/lowering mechanisms 46 to lower the first guard 43. Thereby, the first guard 43 is disposed at a position slightly higher than the lower position and slightly higher than the substrate facing position.

Then, the controller 3 controls the electric motor 23 to accelerate the rotation of the spin base 21 in a stepwise manner. Specifically, the rotation of the spin base is maintained at 500 rpm, for a prescribed time period, then accelerated to 750 rpm and maintained for a prescribed time period, and then accelerated to 1,500 rpm and maintained for a prescribed time period, for example. Thereby, the liquid component on the substrate W is spun off by centrifugal force.

Then, the controller 3 controls the shielding plate rotating mechanism 33 to rotate the shielding plate 6 at 1,000 rpm, for example. The controller 3 controls the shielding plate rotating mechanism 33 to accelerate the rotation of the shielding plate 6 to 1,500 rpm at a timing when the rotational speed of the substrate W becomes 1,500 rpm. Thereby, the spin base 21 and the shielding plate 6 are rotated in synchronization.

In the drying processing (S5), supply of the inert gas from the inert gas flow channel 18 is maintained. The flow rate of the inert gas is, for example, the same as the flow rate when the liquid film removing step is ended (300 liter/min). When the rotation of the substrate W is accelerated to 1,500 rpm, the controller 3 controls the second inert gas valve 67 to reduce the flow rate of the inert gas supplied from the inert gas flow channel 18 to 200 liter/min.

Thereafter, the controller 3 controls the electric motor 23 to interrupt the rotation of the spin chuck 5. Then, the controller 3 controls the shielding plate raising/lowering mechanism 32 to retreat the shielding plate 6 to the higher position. Then, the controller 3 controls the guard raising/lowering mechanisms 46 to 48 to move the guards 43 to 45 to the lower position.

Thereafter, the transfer robot CR enters the processing unit 2, scoops up the already-processed substrate W from the spin chuck 5, and carries the substrate W out of the processing unit 2 (S6). The substrate W is delivered from the transfer robot CR to the transfer robot IR, and housed in the carrier C by the transfer robot IR.

According to the present preferred embodiment, the movement of the atmosphere between the space A formed by the substrate W, the shielding plate 6, and the first guard 43 and the outside of the space A is restricted. By supplying the inert gas to the space A from the inert gas flow channel 18 and replacing the atmosphere in the space A with the inert gas, the oxygen concentration and the humidity of the atmosphere between the upper surface of the substrate W and the facing surface 6a of the shielding plate 6 are rapidly reduced. By the shielding plate raising/lowering mechanism 32 raising/lowering the shielding plate 6 with respect to the substrate W while maintaining the space A, the interval between the upper surface of the substrate W and the facing surface 6a of the shielding plate 6 is properly adjusted in a state where the oxygen concentration and the humidity of the atmosphere between the upper surface of the substrate W and the facing surface 6a of the shielding plate 6 are reduced. Therefore, in a state where the oxygen concentration and the humidity of the atmosphere between the upper surface of the substrate W and the facing surface 6a of the shielding plate 6 are reduced and a proper interval is maintained between the upper surface of the substrate W and the facing surface 6a of the shielding plate 6, the IPA can be supplied from the IPA nozzle 13 to the upper surface of the substrate W and the substrate W can be processed.

In addition, at the time of adjusting the interval between the upper surface of the substrate W and the facing surface 6a of the shielding plate 6, the state where the outer edge portion 6c of the shielding plate 6 and the inner edge portion 43a of the first extension portion 43B of the first guard 43 face each other is maintained. Thus, the movement of the atmosphere between the space A and the outside can be further restricted.

In addition, by raising/lowering the first guard 43 together with the shielding plate 6 with respect to the substrate W, the space A is more easily maintained. Therefore, freedom of adjustment of the interval between the upper surface of the substrate W and the shielding plate 6 is improved.

The shielding plate 6 and the first guard 43 are raised/lowered with respect to the substrate W at the same speed. Therefore, during the adjustment of the interval between the upper surface of the substrate W and the shielding plate 6, extension of the interval between the shielding plate 6 and the first guard 43 can be suppressed. Therefore, the movement of the atmosphere between the space A formed by the substrate W, the shielding plate 6, and the first guard 43, and the outside of the space A can be even further restricted. In addition, the shielding plate 6 and the first guard 43 are relatively raised/lowered with respect to the substrate W at the same time. Therefore, the movement of the atmosphere between the space A and the outside of the space A can be even further restricted.

In addition, the interval between the upper surface of the substrate W and the facing surface 6a of the shielding plate 6 is adjusted such that the IPA nozzle 13 extending from the first guard 43 to the inner side of the space A is capable of moving between the substrate W and the facing surface 6a of the shielding plate 6. Therefore, the IPA nozzle 13 can supply the processing liquid to the upper surface of the substrate W in a state where the atmosphere in the space A is replaced with the inert gas, that is, in a state where the oxygen concentration and the humidity in the atmosphere are reduced.

In addition, the inert gas supplying step is started before the interval adjusting step (interval adjustment step S4b) is ended. Therefore, a time until the start of supply of the IPA to the upper surface of the substrate W in a state where the oxygen concentration and the humidity of the atmosphere between the substrate W and the facing surface 6a of the shielding plate 6 are reduced and the interval between the upper surface of the substrate W and the facing surface 6a of the shielding plate 6 is properly adjusted, is shortened.

The present invention is not limited to the preferred embodiment described above but may be implemented in yet other modes.

For example, in the present preferred embodiment, in the interval adjustment step S4b, the first guard 43 is raised/lowered. However, both before and after the interval adjustment step S4b, as long as the shielding plate 6 has such thickness in the vertical direction Z that the inner edge portion 43a of the first extension portion 43B of the first guard 43 can face the outer edge portion 6c of the shielding plate 6 from the horizontal direction, the first guard 43 is not necessarily raised/lowered in the interval adjustment step S4b unlike the present preferred embodiment.

In addition, in the interval adjustment step S4b, the shielding plate 6 and the first guard 43 only need to be relatively raised/lowered with respect to the substrate W. Therefore, unlike the present preferred embodiment, the interval between the upper surface of the substrate W and the facing surface 6a of the shielding plate 6 may be adjusted by raising/lowering the substrate W. Alternatively, the interval between the upper surface of the substrate W and the facing surface 6a of the shielding plate 6 may be adjusted by raising/lowering any of the shielding plate 6, the first guard 43, and the substrate W.

In the present preferred embodiment, the IPA nozzle 13 is moved around the rotational axis of the nozzle support member 15. However, unlike the present preferred embodiment, the IPA nozzle 13 may be moved linearly in the direction in which the IPA nozzle 13 extends.

In the present preferred embodiment, the chemical liquid nozzle 9 is a moving nozzle that moves in the horizontal direction. However, unlike the present preferred embodiment, the chemical liquid nozzle 9 may be a fixed nozzle disposed so as to discharge the chemical liquid toward the rotation center of the upper surface of the substrate W. In detail, the chemical liquid nozzle 9 may be inserted through the nozzle housing member 35 that is inserted through the hollow shaft 30 together with the DIW nozzle 10, the inert gas nozzle 12, and the central IPA nozzle 11.

The processing unit 2 may include a heater that heats the substrate W in the organic solvent processing. The heater may be incorporated in the spin base 21, may be incorporated in the shielding plate 6, or may be incorporated in both the spin base 21 and the shielding plate 6. In a case where the substrate W is heated in the organic solvent processing, at least one of the lower surface nozzle 8, the heater incorporated in the spin base 21, and the heater incorporated in the shielding plate 6 is used.

The processing liquid supply nozzle is not limited to the IPA nozzle 13 that supplies the organic solvent such as the IPA, etc., to the upper surface of the substrate W but may be a nozzle that supplies a processing liquid other than the IPA to the upper surface of the substrate W. That is, the processing liquid supply nozzle may be a low surface tension liquid nozzle that supplies a low surface tension liquid with lower surface tension than water to the upper surface of the substrate W, may be a chemical liquid nozzle that supplies a chemical liquid to the upper surface of the substrate W, or may be a rinse liquid nozzle that supplies a rinse liquid such as the DIW to the upper surface of the substrate W.

Unlike the present preferred embodiment, the processing unit 2 may include a hydrophobic agent supply nozzle that is housed in the nozzle housing member 35 and supplies a hydrophobic agent to hydrophobize the upper surface of the substrate W.

The hydrophobic agent is, for example, a silicon-based hydrophobic agent that hydrophobizes silicon itself and silicon-containing compounds, or a metal-based hydrophobic agent that hydrophobizes metals themselves and metal-containing compounds. The metal-based hydrophobic agent includes, for example, at least one of amine that has a hydrophobic group and an organic silicon compound. The silicon-based hydrophobic agent is, for example, a silane coupling agent. The silane coupling agent includes at least one of, for example, HMDS (hexamethyldisilazane), TMS (tetramethylsilane), fluorinated alkylchlorosilanes, alkyldisilazanes and non-chloro-based hydrophobic agents. The non-chloro-based hydrophobic agent includes at least one of, for example, dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl)dimethylamine and organosilane compounds.

When the hydrophobic agent is supplied from the hydrophobic agent supply nozzle to the upper surface of the substrate W, in order to prevent fouling of the shielding plate 6 due to backlash of the hydrophobic agent from the upper surface of the substrate W, an interval adjusting step of adjusting the interval between the upper surface of the substrate W and the facing surface 6a of the shielding plate 6 by raising the shielding plate 6 may be executed. Then, after the interval adjusting step, by supplying the hydrophobic agent to the upper surface of the substrate W from the hydrophobic agent supply nozzle, the substrate is processed (processing liquid supplying step).

In substrate processing of the present preferred embodiment, the exhaust amount of the gas from an exhaust pipe (not shown) connected to the first cylindrical portion 43A of the first guard 43 may be adjusted. Specifically, in a state where the space A is formed as shown in FIG. 8C to FIG. 8F, decompression in the space A can be prevented by decreasing the exhaust amount from the exhaust pipe, so that involvement of the atmosphere outside the space A into the space A can be prevented. Thereby, the state where the humidity and the oxygen concentration in the space A are reduced is easily maintained. Conversely, in a state where the space A is not formed as shown in FIG. 8A, FIG. 8B, and FIG. 8G, by increasing the exhaust from the exhaust pipe, the gas in the vicinity of the upper surface of the substrate W can be removed as much as possible. Therefore, fouling of the upper surface of the substrate W can be prevented.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2016-170170 filed on Aug. 31, 2016 at the Japan Patent Office and the entire disclosure of this application is incorporated herein by reference.

What is claimed is:

1. A substrate processing method comprising:
   a substrate holding step of holding a substrate horizontally;
   a facing-disposing step of disposing a facing member such that the facing member faces an upper surface of the horizontally held substrate;
   a space forming step in which a space, where movement of an atmosphere in from and out to an outside is restricted, is formed by the horizontally held substrate, the facing member, and a plurality of guards that surround the horizontally held substrate and the facing member in plan view;
   an inert gas supplying step of supplying an inert gas to the space;
   an interval adjusting step of adjusting an interval between the upper surface of the substrate and the facing member by relatively raising/lowering the facing member with respect to the horizontally held substrate while maintaining the space; and
   a processing liquid supplying step of supplying a processing liquid to the upper surface of the horizontally held substrate after the interval adjusting step,
   wherein the plurality of the guards include a first guard and a second guard which faces the first guard from below,
   the space forming step includes a step in which an inner edge portion of the first guard and an outer edge portion of the facing member face each other and an inner edge portion of the second guard and an outer edge portion of the substrate face each other, so that the space is formed, and
   the interval adjusting step includes a step in which the interval between the upper surface of the substrate and the facing member is adjusted while maintaining a state where the inner edge portion of the first guard and the outer edge portion of the facing member face each other and the inner edge portion of the second guard and the outer edge portion of the substrate face each other.

2. The substrate processing method according to claim 1, wherein the interval adjusting step includes a step of adjusting the interval between the upper surface of the horizontally held substrate and the facing member such that a processing liquid supply nozzle extending from the first guard to an inner side of the space moves between the horizontally held substrate and the facing member.

3. The substrate processing method according to claim 1, wherein the inert gas supplying step is started before the interval adjusting step is ended.

4. The substrate processing method according to claim 1, wherein the first guard includes a first cylindrical portion which surrounds the substrate, and a first extension portion which extends toward an inner side of the first cylindrical portion from an upper end of the first cylindrical portion,
   the second guard includes a second cylindrical portion which surrounds the substrate on the inner side of the first cylindrical portion, and a second extension portion which extends toward an inner side of the second cylindrical portion from an upper end of the second cylindrical portion and faces the first extension portion from below, the space forming step includes a step in which an inner edge portion of the first extension portion and the outer edge portion of the facing member face each other and an inner edge portion of the second extension portion and the outer edge portion of the substrate face each other, so that the space is formed, the interval adjusting step includes a step in which the interval between the upper surface of the substrate and the facing member is adjusted while maintaining a state where the inner edge portion of the first extension portion and the outer edge portion of the facing member face each other and the inner edge portion of the second extension portion and the outer edge portion of the substrate face each other.

5. The substrate processing method according to claim 1, wherein the interval adjusting step includes a step of relatively raising/lowering the first guard together with the facing member with respect to the horizontally held substrate.

6. The substrate processing method according to claim 5, wherein the interval adjusting step includes a step of relatively raising/lowering the facing member and the first guard with respect to the horizontally held substrate at the same speed.

7. The substrate processing method according to claim 5, wherein the interval adjusting step includes a step of relatively raising/lowering the facing member and the first guard with respect to the horizontally held substrate at the same time.

* * * * *